United States Patent
Hayashi et al.

(10) Patent No.: US 10,610,981 B2
(45) Date of Patent: Apr. 7, 2020

(54) SOLDER PASTE FOR REDUCTION GAS, AND METHOD FOR PRODUCING SOLDERED PRODUCT

(71) Applicants: ORIGIN ELECTRIC COMPANY, LIMITED, Saitama (JP); KOKI COMPANY LIMITED, Tokyo (JP)

(72) Inventors: Yukiko Hayashi, Saitama (JP); Arisa Shiraishi, Saitama (JP); Naoto Ozawa, Saitama (JP); Takayuki Suzuki, Saitama (JP); Takeshi Shirai, Tokyo (JP); Noriyoshi Uchida, Tokyo (JP); Mitsuyasu Furusawa, Tokyo (JP)

(73) Assignees: ORIGIN COMPANY, LIMITED, Saitama (JP); KOKI COMPANY LIMITED, Tokyo (JP)

( * ) Notice: Subject to any disclaimer, the term of this patent is extended or adjusted under 35 U.S.C. 154(b) by 0 days.

(21) Appl. No.: 15/764,165

(22) PCT Filed: Sep. 29, 2016

(86) PCT No.: PCT/JP2016/078961
§ 371 (c)(1),
(2) Date: Sep. 14, 2018

(87) PCT Pub. No.: WO2017/057651
PCT Pub. Date: Apr. 6, 2017

(65) Prior Publication Data
US 2019/0009375 A1  Jan. 10, 2019

(30) Foreign Application Priority Data

Sep. 30, 2015  (JP) .................................. 2015-195177

(51) Int. Cl.
*B23K 35/38* (2006.01)
*B23K 3/04* (2006.01)
(Continued)

(52) U.S. Cl.
CPC ............ *B23K 35/38* (2013.01); *B23K 1/0016* (2013.01); *B23K 1/19* (2013.01); *B23K 1/20* (2013.01);
(Continued)

(58) Field of Classification Search
CPC ... B23K 1/19; B23K 1/20; B23K 3/04; B23K 3/0638; B23K 3/35; B23K 3/26;
(Continued)

(56) References Cited

U.S. PATENT DOCUMENTS

| 2004/0000355 A1* | 1/2004 | Suga .................... B23K 35/262 148/25 |
| 2013/0105558 A1* | 5/2013 | Abe ...................... B23K 1/0016 228/179.1 |
| 2015/0027589 A1* | 1/2015 | Okada ................ B23K 35/3613 148/24 |

FOREIGN PATENT DOCUMENTS

| EP | 2587900 A1 | 5/2013 |
| JP | 1990-290693 A | 11/1990 |

(Continued)

OTHER PUBLICATIONS

EPO Communication of the extended European Search Report dated Mar. 20, 2019 for Application No. 16851822.3, 14 pages.

(Continued)

*Primary Examiner* — Brian W Jennison
(74) *Attorney, Agent, or Firm* — Squire Patton Boggs (US) LLP

(57) ABSTRACT

The present invention provides a solder paste free of reducing agents and activators, and a method for producing a soldered product in which the solder paste is used to achieve solder bonding. The solder paste for reducing gas of the present invention is a solder paste for reducing gas used together a reducing gas. The solder paste contains a solder powder; a thixotropic agent that is solid at normal temperature; and a solvent, and is free of reducing agents for removal of oxide films and free of activators for improvement of reducibility.

23 Claims, 9 Drawing Sheets

(51) Int. Cl.
- *B23K 3/06* (2006.01)
- *H05K 3/34* (2006.01)
- *B23K 1/20* (2006.01)
- *B23K 35/02* (2006.01)
- *B23K 1/00* (2006.01)
- *C22C 13/00* (2006.01)
- *B23K 35/22* (2006.01)
- *B23K 1/19* (2006.01)
- *B23K 35/26* (2006.01)
- *B23K 35/36* (2006.01)
- *B23K 37/00* (2006.01)
- *B23K 101/42* (2006.01)
- *B23K 101/34* (2006.01)
- *B23K 103/12* (2006.01)

(52) U.S. Cl.
CPC ............. *B23K 3/04* (2013.01); *B23K 3/0638* (2013.01); *B23K 35/025* (2013.01); *B23K 35/22* (2013.01); *B23K 35/262* (2013.01); *B23K 35/3615* (2013.01); *B23K 37/003* (2013.01); *C22C 13/00* (2013.01); *H05K 3/3463* (2013.01); *B23K 35/26* (2013.01); *B23K 2101/34* (2018.08); *B23K 2101/42* (2018.08); *B23K 2103/12* (2018.08); *H05K 3/3484* (2013.01); *H05K 2203/1157* (2013.01)

(58) Field of Classification Search
CPC .... B23K 35/22; B23K 35/262; B23K 35/025; B23K 35/3615; B23K 3/38; B23K 37/003; B23K 2103/12; B23K 2101/34; B23K 2101/42
USPC ........................................................ 219/74
See application file for complete search history.

(56) References Cited

FOREIGN PATENT DOCUMENTS

| | | |
|---|---|---|
| JP | 1996-108292 A | 4/1996 |
| JP | 1999-JPH11-221668 A | 8/1999 |
| JP | 2000-197990 A | 7/2000 |
| JP | 2001/058259 A | 3/2001 |
| JP | 2004-025305 A | 1/2004 |
| JP | 2006-167735 A | 6/2006 |
| JP | 2008-246563 A | 10/2008 |
| JP | 2010-114197 A | 5/2010 |

OTHER PUBLICATIONS

International Search Report for PCT/JP2016/078961, dated Apr. 6, 2017, with translation (5 pgs).

* cited by examiner

Example 10  Example 11  Example 12

Comparative Example 2

SOLDER PASTE FOR REDUCTION GAS, AND METHOD FOR PRODUCING SOLDERED PRODUCT

TECHNICAL FIELD

The present invention relates to a solder paste for a reducing gas and a method for producing a soldered product, and, more particularly, to a solder paste free of reducing agents and activators, and a method for producing a soldered product using the same.

BACKGROUND ART

Solder pastes can be supplied by printing and therefore have an advantage of high productivity. Usually, a solder paste contains a solder powder and a flux. Flux components include a reducing agent, an activator, a thixotropic agent (binder), a solvent, and a tackifier resin. The reducing agent has a role of removing oxide films on surfaces of soldering targets and the solder powder during soldering, and the activator has a role of improving reducibility and improving wettability of the solder.

The flux remains as flux residues after soldering. Among the flux components, the reducing agent and activator have a significant effect on the performance of soldering, corrosion and migration. As the reduction effect is higher, the soldering properties improve. However, these active components are easily ionized and have high affinity with water, and, therefore, tend to cause corrosion and ion migration.

For these reasons, when a solder paste containing a reducing agent and an activator is used, it is necessary to wash away flux residues after soldering as described in Patent Documents 1 and 2 (Patent Document 1, paragraphs 0002 to 0004, and Patent Document 2, paragraph 0002).

PRIOR ART DOCUMENT

Patent Document

Patent Document 1: Japanese patent application publication no. Hei 11-221668 (JP-A-Hei 11-221668)
Patent Document 2: Japanese patent registration No. 4818181

SUMMARY OF THE INVENTION

Problem to be Solved by the Invention

However, when flux residues are washed away with a washing liquid, the amount of washing liquid is so large that environmental load and cost increase. In addition, some products cannot be washed by a flux residue washing method.

In view of the above problems, an object of the present invention is to provide a solder paste free of reducing agents and activators, and a method for producing a soldered product in which the solder paste is used to achieve solder bonding.

Means for Solving the Problem

When a solder paste is composed only of a solder powder, a thixotropic agent and a solvent, the solder paste naturally has no reduction effect and good solder wettability cannot be achieved. Conventional solder pastes contain a reducing agent and an activator in order to obtain a reduction effect. The present inventors found that sufficient wettability cannot be obtained by combining a conventional solder paste with a reducing gas but sufficient wettability can be obtained with a solder paste free of reducing agents and activators when penetration of a reducing gas can be ensured, and accomplished the present invention.

A solder paste for reducing gas according to a first aspect of the present invention is a solder paste for use with a reducing gas. The solder paste contains a solder powder; a thixotropic agent that is solid at normal temperature; and a solvent; and is free of reducing agents for removal of oxide films and free of activators for improvement of reducibility.

The "thixotropic agent" allows prevention of separation between the solder powder and other components and prevention of sag, for example, and the "solvent" allows viscosity adjustment, for example. A solvent that evaporates at a temperature lower than a melting temperature of the solder powder is preferred. The solvent may evaporate at a temperature lower than a melting temperature of the thixotropic agent. The "reducing agent" refers to a component that removes oxide films, and the "activator" refers to a component that improves reducibility. The expression "free of reducing agents" means containing no reducing agent or containing a reducing agent, if any, in such an amount that the effect of the present invention is not hindered, and the expression "free of activators" means containing no activator or containing an activator, if any, in such an amount that the effect of the present invention is not hindered. In other words, as long as the effect of the present invention is not hindered, other components, such as reducing agents, activators and additives, may be contained. The solder paste of the present invention is a three-component solder paste essentially consisting of a solder powder, a thixotropic agent and a solvent.

With this configuration, a solder paste that has less voids and causes less flux scattering and that leaves less flux residues and requires no washing can be obtained.

A solder paste for reducing gas according to a second aspect of the present invention is the solder paste for reducing gas according to the above first aspect of the present invention, in which the thixotropic agent is a thixotropic agent that satisfies a wet-spreading area rate of 0 to 50% in the following procedures (1) to (5), (1) Applying a paste obtained by removing the solder powder from a solder paste consisting of a solder powder, a thixotropic agent and a solvent to a thickness of 100 µm (metal mask thickness) in a 5×5 mm sized region on a nickel-plated copper substrate (20×20 mm, thickness 2 mm);

(2) Measuring the area of the paste one minute after the application;

(3) Placing the copper substrate on a hot plate at normal temperature and heating the copper substrate until the copper substrate reaches a predetermined temperature;

(4) Removing the copper substrate from the hot plate when the predetermined temperature is reached and cooling the copper substrate; and (5) Measuring the area of the paste on the copper substrate after cooling;

where the predetermined temperature in the procedure (3) is a melting point of the thixotropic agent under normal pressure.

Pastes that have a wet-spreading area rate of 0% include those containing a thixotropic agent that is solid at the reduction temperature.

With this configuration, the thixotropic agent stays on the spot or wet-spreads narrowly even when melted at its melting point and, therefore, do not inhibit penetration and reduction by the reducing gas.

A solder paste for reducing gas according to a third aspect of the present invention is the solder paste for reducing gas according to the above first or second aspect of the present invention, in which the solder powder and the thixotropic agent melt at a temperature higher than the temperature for reduction with the reducing gas.

With this configuration, the solder powder and the thixotropic agent do not melt but stay in a solid form at the reduction temperature, the reducing gas can readily penetrate into gaps between the solder powder particles, between the thixotropic agent particles, and between the solder powder and thixotropic agent particles.

A solder paste for reducing gas according to a fourth aspect of the present invention is the solder paste for reducing gas according to any one of the above first to third aspects of the present invention, in which the reducing gas is formic acid or hydrogen.

With this configuration, a solder paste suitable for gases commonly used as reducing gases is obtained.

A solder paste for reducing gas according to a fifth aspect of the present invention is the solder paste for reducing gas according to any one of the above first to fourth aspects of the present invention, in which the thixotropic agent is an amide-based thixotropic agent.

With this configuration, because the thixotropic agent stays in a solid form or wet-spreads narrowly even when melted at the reduction temperature, the thixotropic agent does not inhibit penetration and reduction by the reducing gas.

A solder paste for reducing gas according to a sixth aspect of the present invention is the solder paste for reducing gas according to any one of the above first to fifth aspects of the present invention, in which the thixotropic agent is a thixotropic agent that satisfies a wet-spreading area rate of 0 to 50% in a method including the procedures (1) to (5), and in which the predetermined temperature in the procedure (3) is the temperature for reduction with the reducing gas.

With this configuration, the thixotropic agent stays in a solid form or wet-spreads narrowly even when melted at the reduction temperature and, therefore, does not inhibit penetration and reduction by the reducing gas.

A solder paste for reducing gas according to a seventh aspect of the present invention is the solder paste for reducing gas according to any one of the above first to sixth aspects of the present invention, in which the solvent shows a weight loss of 25% or more at a rate of temperature increase of 10° C./min in thermogravimetry (TG) under normal pressure at 180° C.

With this configuration, a solder paste suitable for a reducing gas having a reduction temperature of 150 to 300° C. is obtained.

A method for producing a soldered product according to an eighth aspect of the present invention comprises, as shown in a method B in FIG. 1, for example, a provision step of providing a solder paste S according to any one of the above first to seventh aspects of the present invention;

an application step B1 of applying the solder paste to a soldering target;

an evaporation step B2 of evaporating the solvent by heating the soldering target with the solder paste applied thereto to any temperature lower than a melting temperature of the solder powder;

concurrent with or after the evaporation step, a reduction step B3 of reducing the solder powder left as a result of the evaporation step and the soldering target with a reducing gas at any temperature lower than a melting temperature of the solder powder; and after the reduction step, a solder melting step B4 of heating the soldering target to any temperature equal to or higher than a melting temperature of the solder powder to melt the solder powder.

With this configuration, the solder powder does not melt during reduction and gaps formed between the solder powder particles allow effective reduction of the solder powder and the soldering target. In addition, because the solder paste is free of reducing agents and activators, soldering with less voids and less flux scattering can be achieved. Further, the following advantages can be achieved: the amount of flux residues can be reduced; the flux residues are nonionic and therefore there is no need to wash them away after soldering; reduction in reliability caused by active components in the flux residues can be prevented; and pin contactability improves.

A method for producing a soldered product according to a ninth aspect of the present invention is the method for producing a soldered product according to the above eighth aspect of the present invention, further comprising a vacuuming step of placing the soldering target in a vacuum; in which the solvent is evaporated by heating the soldering target in the vacuum in the evaporation step.

The term "vacuum" refers to a space having a pressure lower than the atmospheric pressure (so-called reduced pressure).

With this configuration, evaporation of the solvent can be accelerated. In addition, because even a solvent having a boiling point that is higher than the reduction temperature under normal pressure can be evaporated efficiently, the types of usable solvents can be increased.

A method for producing a soldered product according to a tenth aspect of the present invention is the method for producing a soldered product according to the above ninth aspect of the present invention, in which gaps are formed between the solder powder particles as a result of evaporation of the solvent in the evaporation step, and in which, in the reduction step, the soldering target is reduced by introducing the reducing gas into the gaps after the soldering target is placed in the vacuum.

With this configuration, penetration of the reducing gas into gaps between the solder powder particles and so on can be facilitated.

A method for producing a soldered product according to an eleventh aspect of the present invention is the method for producing a soldered product according to the above ninth or tenth aspect of the present invention, in which, in the solder melting step, the solder powder is melted by heating the soldering target to a melting temperature of the solder powder or higher after the soldering target is placed in the vacuum, and the method further including: after the solder melting step, a vacuum breaking step of breaking, by increasing pressure, the vacuum created in the vacuuming step to compress or eliminate cavities (voids) in the solder powder; and, after the vacuum breaking step, a cooling step of cooling the soldering target.

With this configuration, the cavities (voids) can be squashed while the solder is in a molten state in the vacuum breaking step and the solder can be solidified after the cavities are squashed. Thus, the decrease of fatigue life caused by voids in the solder can be further restrained.

A method for producing a soldered product according to a twelfth aspect of the present invention is the method for producing a soldered product according to any one of the above eighth to eleventh aspects of the present invention, in which the reducing gas is a formic acid gas.

With this configuration, the solder powder and the soldering target can be reduced at a temperature lower than 300° C.

Effect of the Invention

According to the present invention, there can be obtained a solder paste that not only has a feature of solder pastes, high productivity, but also leaves less flux residues than conventional products and does not need washing. In addition, there can be obtained a method for producing a soldered product using the solder paste.

BRIEF DESCRIPTION OF DRAWINGS

FIG. 1A shows a conventional method and FIG. 1B shows a method of the present invention.

DESCRIPTION OF EMBODIMENTS

Figure 1:
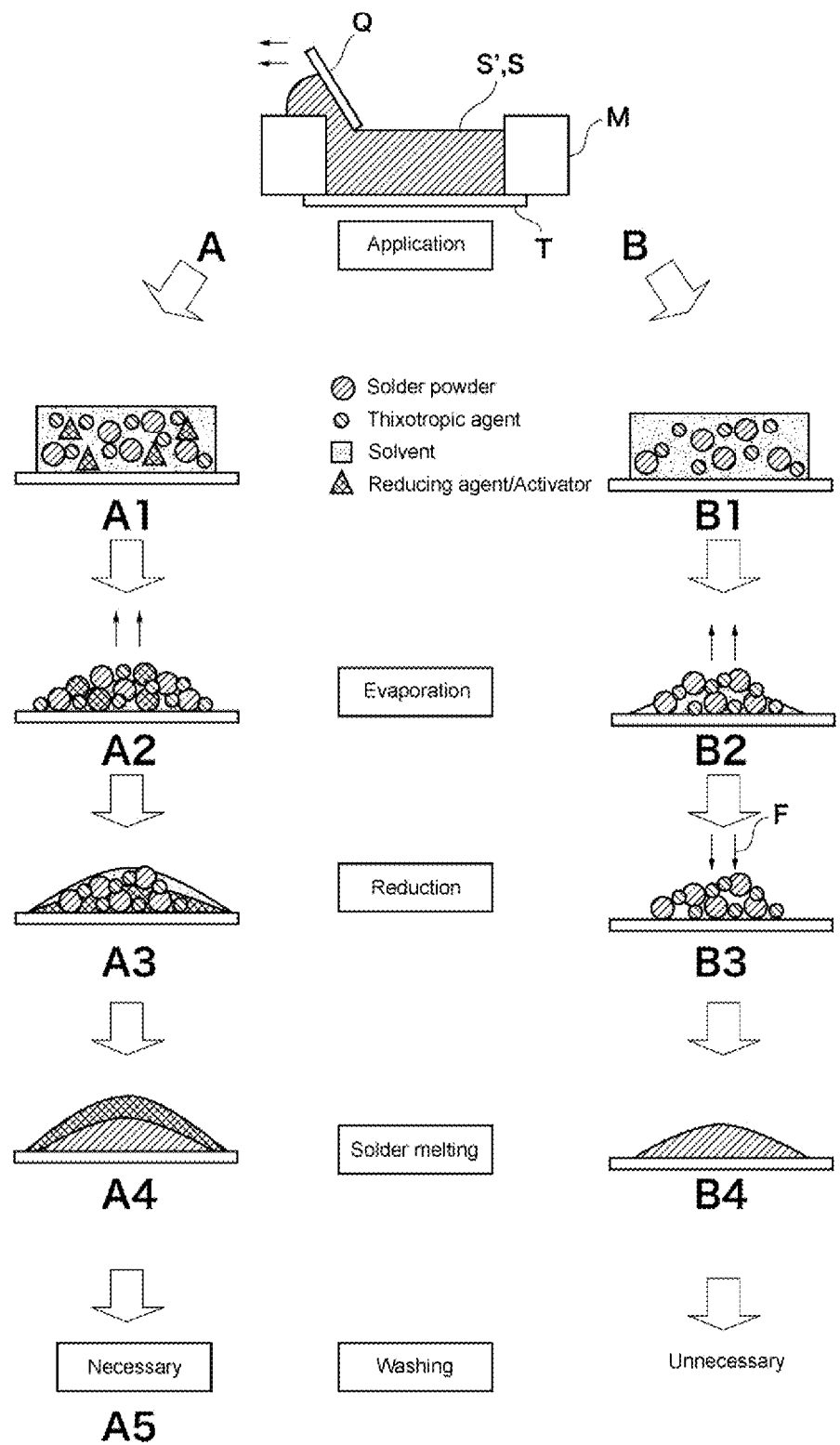
FIG. 1 is a diagram, illustrating overviews of methods for producing a soldered product.

This application is based on Japanese Patent Application No. 2015-195177, filed on Sep. 30, 2015 in Japan, the contents of which are hereby incorporated in its entirety by reference into the present application, as part thereof. The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art within the spirit and scope of the present invention on the basis of the detailed description. The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same or similar reference numerals in all the drawings, and their descriptions are not repeated. Further, the present invention is not limited to the following embodiments.

[Solder Paste for Reducing Gas]

A solder paste for a reducing gas according to a first embodiment of the present invention is described.

The solder paste for a reducing gas of the present invention contains a solder powder, and a thixotropic agent and a solvent as a flux, but contains no reducing agent and no activator. Evan if the solder paste contains a reducing agent or an activator, its amount is such that the effects of the present invention are not hindered or smaller.

Here, a reducing agent is a substance that removes oxide films on surfaces of soldering targets and of the solder powder during soldering. Examples include rosin and rosin derivatives.

An activator is a substance that improves reducibility and improves wettability of the solder. Examples include amine-hydrohalic acid salts and organic acids. Examples of the amine-hydrohalic acid salts include diethylamine hydrobromides and cyclohexylamine hydrobromides. Examples of the organic acids include glutaric acid, adipic acid, azelaic acid, sebacic acid, stearic acid and benzoic acid.

The solder paste for a reducing gas of the present invention may contain compounds (additives or the like) other than a solder powder, a thixotropic agent and a solvent except for a reducing agent and an activator as long as the effects of the invention can be achieved.

When soldering is carried out using the solder paste of the present invention, a reducing gas is used for reduction. Preferably, the solder powder and the thixotropic agent contained in the solder paste of the present invention do not melt at the temperature for reduction with the reducing gas and the gas pressure during reduction. In other words, the melting temperature of the thixotropic agent is any temperature higher than the reduction temperature. The melting temperature of the solder powder is any temperature higher than the reduction temperature, and is preferably 10 to 50° C. higher than the reduction temperature in this embodiment.

In addition, the solvent preferably evaporates (vaporizes) at a temperature equal to or lower than the reduction temperature. The temperature at which the solvent evaporates is any temperature equal to or lower than the reduction temperature, and is, for example, 0 to 100° C. A mechanism for adjusting the pressure of atmosphere enables a solvent that has a boiling point higher than the reduction temperature under normal pressure to evaporate at a temperature lower than the reduction temperature. As described above, the solvent needs to evaporate at a temperature equal to or lower than the reduction temperature under a predetermined gas pressure.

In other words, the solder paste of the present invention contains materials having the following relationship under a predetermined gas pressure. Evaporation temperature of solvent≤Reduction temperature<Melting point of solder powder, melting point of thixotropic agent The "melting point" above refers to the temperature at which the substance melts regardless of the gas pressure.

As described above, the solder powder and the thixotropic agent need to be solid and the solvent needs to be gaseous at the temperature for reduction with the reducing gas, and the solder powder, the thixotropic agent and the solvent are combined as appropriate depending on the reduction temperature.

Alternatively, a thixotropic agent that melts at the reduction temperature can be used as a thixotropic agent for the solder paste of the present invention as long as it has low wet-spreadability in a molten state.

In the following, the thixotropic agent may be referred to also as "binder" or "gelling agent," but the terms "thixotropic agent," "binder," and "gelling agent" are synonymous.

Solder Powder

The alloy composition of the solder powder is not particularly limited. Various types of solder alloys presently used in bump formation or mounting on printed-circuit boards can be used. Examples include powders of lead-free solder alloys used as lead-free solders, such as Sn—Ag solder, Sn—Ag—Cu solder, Sn—Ag—Cu—Bi solder, Sn—Ag—In—Bi solder, Sn—Cu solder, Sn—Zn solder and Sn—Bi solder, and a variable melting point alloy A-FAP.

Thixotropic Agent

The thixotropic agent adjusts the viscosity of the solder paste or promotes adherence of substances. Preferably, the thixotropic agent is solid at normal temperature and normal pressure and does not melt at the gas pressure and temperature during reduction but may melt when the solder powder melts, and is not an active (ionic) material. Alternatively, a thixotropic agent that melts at the gas pressure and temperature during reduction but has low wet-spreadability in a molten state is preferred. Because the reduction temperature depends on the type of the reducing gas, the thixotropic agent is selected as appropriate depending on the reducing gas.

A thixotropic agent that has low wet-spreadability in a molten state can be determined by the following method.

A thixotropic agent that satisfies a wet-spreading area rate, as determined by the following procedures (1) to (5), of 0 to 50%, preferably 0 to 25%, especially preferably 0 to 15%, is preferred. The predetermined temperature is the melting point of the thixotropic agent under normal pressure.

(1) Applying a paste obtained by removing the solder powder from a three-component solder paste (in other words, thixotropic agent+solvent) to a thickness of 100 μm (metal mask thickness) in a 5×5 mm sized region on a nickel-plated copper substrate (20×20 mm, thickness 2 mm);

(2) Measuring the area of the paste one minute after the application;

(3) Placing the copper substrate on a hot plate at normal temperature and heating the copper substrate until the copper substrate reaches a predetermined temperature;

(4) Removing the copper substrate from the hot plate when the predetermined temperature is reached and cooling the copper substrate. The copper substrate is cooled by natural cooling until the copper substrate reaches room temperature;

(5) Measuring the area of the paste on the copper substrate after cooling.

Alternatively, the thixotropic agent may be a thixotropic agent that satisfies a wet-spreading area rate of 0 to 50%, preferably 0 to 25%, especially preferably 0 to 15% in the above procedures (1) to (5), wherein the predetermined temperature is the temperature for reduction with the reducing gas. Pastes that have a wet-spreading area rate of 0% include those containing a thixotropic agent that is solid at the reduction temperature.

Examples of the thixotropic agent include amide-based thixotropic agents and sorbitol-based thixotropic agents. An amide-based thixotropic agent is a compound containing an amide bond (—CONH—), and examples thereof include higher fatty acid amides such as stearic acid amide, unsaturated fatty acid monoamides such as ethylene-bis-stearoamide, lauric acid amide and oleic acid amide, substituted amides such as N-lauryl lauric acid amide and N-stearyl stearic acid amide, methylol amides such as methylol stearic acid amide, ethylene oxide adducts of fatty acid amides, fatty acid ester amides, fatty acid ethanol amides, substituted ureas such as N-butyl-N'-stearyl urea, saturated fatty acid bisamides such as methylenebis stearic acid amide, ethylenebis lauric acid amide and ethylenebis hydroxystearic acid amide; unsaturated fatty acid bisamides such as methylenebis oleic acid amide; and aromatic bisamides such as m-xylylene bis-stearic acid amide. A polyamide obtained by condensation polymerization of a diamine with a dicarboxylic acid may be also used. Examples of the diamine include ethylenediamine, putrescine and hexamethylenediamine. Examples of the dicarboxylic acid include malonic acid, succinic acid, glutaric acid, adipic acid, pimelic acid, suberic acid, azelaic acid, sebacic acid, phthalic acid, isophthalic acid and dodecanedioic acid. These amide-based thixotropic agents may be used singly or in combination of two or more kinds. Examples of the sorbitol-based thixotropic agents include sorbitol and benzylidene sorbitols such as bis(p-methylbenzylidene)sorbitol, bis(p-ethylbenzylidene)sorbitol, dibenzylidene sorbitol, tribenzylidene sorbitol and alkyl-substituted dibenzylidene sorbitols having three or more carbon atoms. Examples other than the amide-based thixotropic agents and sorbitol-based thixotropic agents include hardened castor oil, beeswax and carnauba wax. The above thixotropic agents may be used singly or in combination of two or more kinds. The thixotropic agent may be in any form, and may be granular or flaky. A thixotropic agent swollen with a solvent may be used. Among the above thixotropic agents, the use of hardened castor oil, a higher fatty acid amide or the like is preferred because those can allow the solder paste to maintain good thixotropy during printing. Especially preferred is a carboxylic acid amide-based wax having a melting point of 180° C. or higher at normal pressure and a molecular weight of 500 or higher.

These thixotropic agents enable the solder paste to have an increased viscosity, an increased thixotropic ratio (improved printability), and improved heat sag properties. These thixotropic agents may remain in the solder as residues. However, the thixotropic agents remain in a very small amount (typically, 1% by mass or less) and are not active substances, and therefore do not cause corrosion of the soldering targets (metals). Thus, even if the thixotropic agents remain as residues, washing is unnecessary.

The solder paste of the present application may further contain a low-melting point thixotropic agent that melts at a temperature lower than the reduction temperature for adjustment of viscosity, improvement of printability and storage stability as long as the reduction effect of the reducing gas is not hindered.

The melting point of the thixotropic agent (at normal pressure) is, for example, 80 to 270° C.

Solvent

The solvent is not particularly limited as long as it disperses the solder powder and the thixotropic agent, imparts a structural viscosity to (gelate) the solder paste, and allows viscosity adjustment. In addition to commonly used liquid solvents, solid solvents or high-viscosity solvents can be also used.

Examples of the solvent include glycol-based solvents, glycol ether-based solvents and alcohol-based solvents. Specific examples include triethylene glycol monomethyl ether, triethylene glycol dimethyl ether, tetraethylene glycol dimethyl ether, diethylene glycol monomethyl ether, diethylene glycol monobutyl ether, diethylene glycol monohexyl ether, ethylene glycol monophenyl ether, diethylene glycol monophenyl ether, diethylene glycol monobutyl acetate, dipropylene glycol, diethylene glycol-2-ethylhexyl ether, α-terpineol, benzyl alcohol, 2-hexyldecanol, 2-ethyl-1,3-hydroxyhexane, 1,8-hydroxyoctane, butyl benzoate, diethyl adipate, diethyl phthalate, dodecane, tetradecene, dodecylbenzene, ethylene glycol, diethylene glycol, dipropylene glycol, triethylene glycol, hexylene glycol, 1,5-dihydroxypentane, methyl carbitol, butyl carbitol, isostearyl alcohol, oleyl alcohol, octyldodecanol, chimyl alcohol, stearyl alcohol, cetyl alcohol, decyltetra alcohol, hexyldecanol, behenyl alcohol and lauryl alcohol. The above solvents may be used singly or in combination of two or more kinds.

Preferred is a solvent that has a weight loss of 25% or more, more preferably 40% or more, especially preferably 60% or more, at a rate of temperature rise of 10° C./min as measured by thermogravimetry (TG) at normal pressure and 180° C. A solvent having a weight loss of 25% or more is preferred because the amount of flux residues decreases and voids in bonding layers decrease.

Reducing Gas

Examples of the reducing gas that is used together with the solder paste for a reducing gas include hydrogen, gases of carboxylic acids such as formic acid, gases of organic acids other than carboxylic acids, gases of organic compounds other than organic acids, and other reductive gases other than organic compounds.

The reduction temperature is preferably 150 to 450° C. regardless of whether the reduction is carried out at normal pressure or under vacuum. For example, when the reducing gas is formic acid, the reduction temperature is 150 to 300° C., preferably 160 to 250° C., especially preferably 170 to 230° C. When the reducing gas is hydrogen, the reduction temperature is 250 to 450° C., preferably 260 to 400° C., especially preferably 270 to 350° C.

The solder powder has an average particle size in the range of 20 to 45 μm, for example. However, a solder powder having a larger or smaller diameter may be used as appropriate depending on the size of the printing opening.

The term "average particle size" as used herein means the particle size at a cumulative value of 50% in the particle size distribution obtained by a laser diffraction/scattering method.

As one example, when formic acid is used as the reducing gas and the reduction temperature is about 200° C., the use of a solvent that evaporates at about 180° C. or lower and a thixotropic agent that melts at about 210° C. or higher is preferred. The use of formic acid is preferred because formic acid enables reduction to be carried out at a lower temperature compared to other reducing gases.

The percentage compositions of the solder powder, the thixotropic agent and the solvent are 80 to 99% by mass of the solder powder, 0.1 to 2% by mass of the thixotropic agent and 0.9 to 18% by mass of the solvent, preferably 85 to 95% by mass of the solder powder, 0.5 to 1.5% by mass of the thixotropic agent and 4.5 to 13.5% by mass of the solvent. For example, the solder powder, the thixotropic agent and the solvent constitute 89% by mass, 1% by mass and 10% by mass, respectively, or the solder powder, the thixotropic agent and the solvent constitute 90% by mass, 1% by mass and 9% by mass, respectively.

The solder paste of the present application is obtained by mixing the solder powder, the thixotropic agent and the solvent at the above ratio to form a paste. The amounts of the thixotropic agent and the solvent may be changed as appropriate depending on the degree of viscosity adjustment. The thixotropic agent and the solvent can be mixed by stirring while heating. The mixing with the solder powder can be achieved by using a stirrer at normal temperature.

[Method for Producing Soldered Product]

Referring to FIG. 1, a method for producing a soldered product according to a second embodiment of the present invention is outlined in comparison with a conventional method. A method A in FIG. 1 is a conventional method, and the solder paste used contains a solder powder, and a reducing agent, an activator, a thixotropic agent and a solvent as a flux. A method B is the method for producing a soldered product of the present invention, and the solder paste used contains a solder powder, and a thixotropic agent and a solvent as a flux but contains no reducing agent and no activator.

In the following, description is made using a soldering target T and a solder paste S as members to be bonded in FIG. 1.

First, in the method A, a solder paste S' is applied to the soldering target T by screen printing or the like (A1). When the soldering target T and the solder paste S' shown in FIG. 1 are heated, the solvent starts to evaporate (A2). Heating is further continued to induce reduction by a molten flux containing the reducing agent and the activator (A3). Heating is further continued to the solder melting temperature to achieve soldering (A4). Because approximately 10% of the flux remains as flux residues, washing is carried out to remove the flux residues (A5).

On the other hand, in the method B, the solder paste S is applied to the soldering target T by screen printing or the like (B1). When the soldering target T and the solder paste S shown in FIG. 1 are heated, the solvent starts to evaporate (B2). Heating is further continued to the reduction temperature to induce reduction by a reducing gas F (B3). Heating is further continued to the solder melting temperature to achieve soldering (B4). Although the thixotropic agent remains as residues, washing is unnecessary because the amount is typically 1% or less and because the thixotropic agent is not an active substance. In the method B, because the melting temperatures of the solder powder and the thixotropic agent are higher than the reduction temperature, the solder powder and the thixotropic agent do not melt during the reduction. Thus, gaps are formed between the solder powder particles, between the thixotropic agent particles and between the solder powder and thixotropic agent particles, and facilitate penetration and reduction by the reducing gas. Even with a thixotropic agent that melts during the reduction, the thixotropic agent, which has low wet-spreadability in a molten state, remains on the spot and does not inhibit penetration and reduction by the reducing gas. It should be noted that the reduction may occur either simultaneously with or after the evaporation of the solvent.

Figure 2:
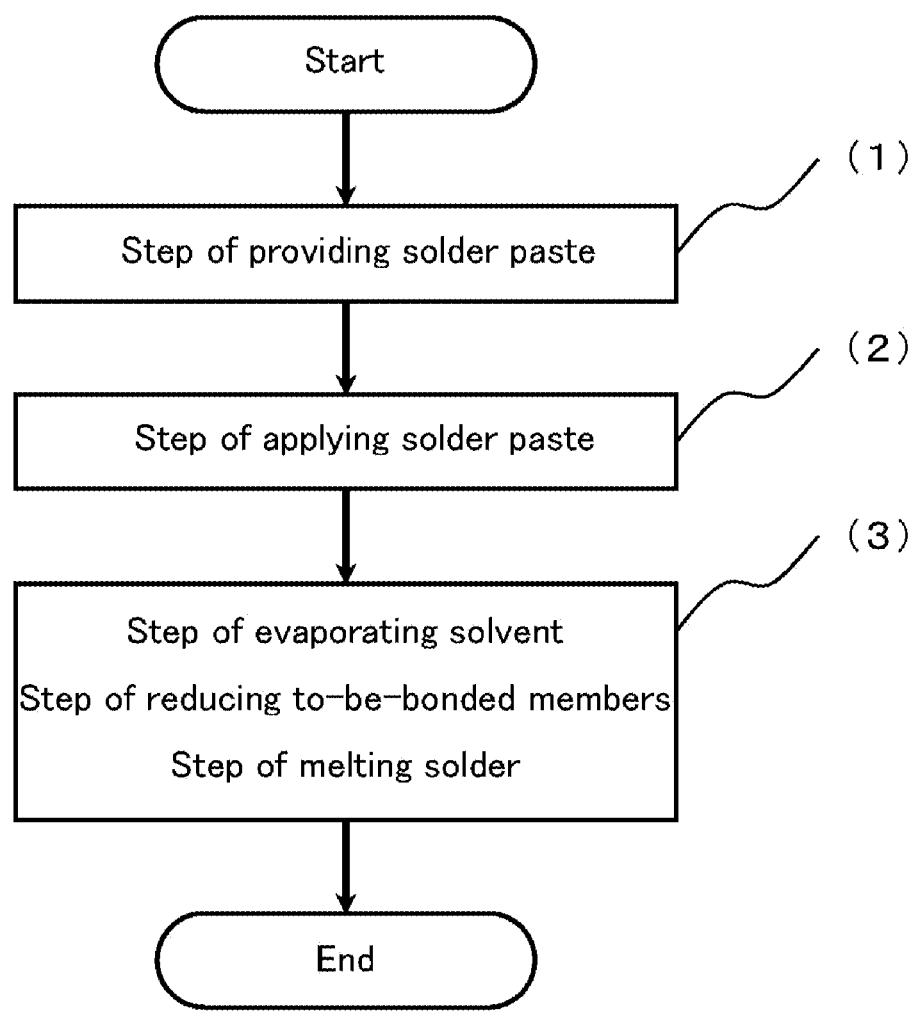
FIG. 2 is a flowchart, illustrating a method for producing a soldered product of the present invention.

Referring to FIG. 2, the method for producing a soldered product according to a second embodiment of the present invention is described in more detail. FIG. 2 is a flowchart illustrating the method for producing a soldered product.

Figure 3:
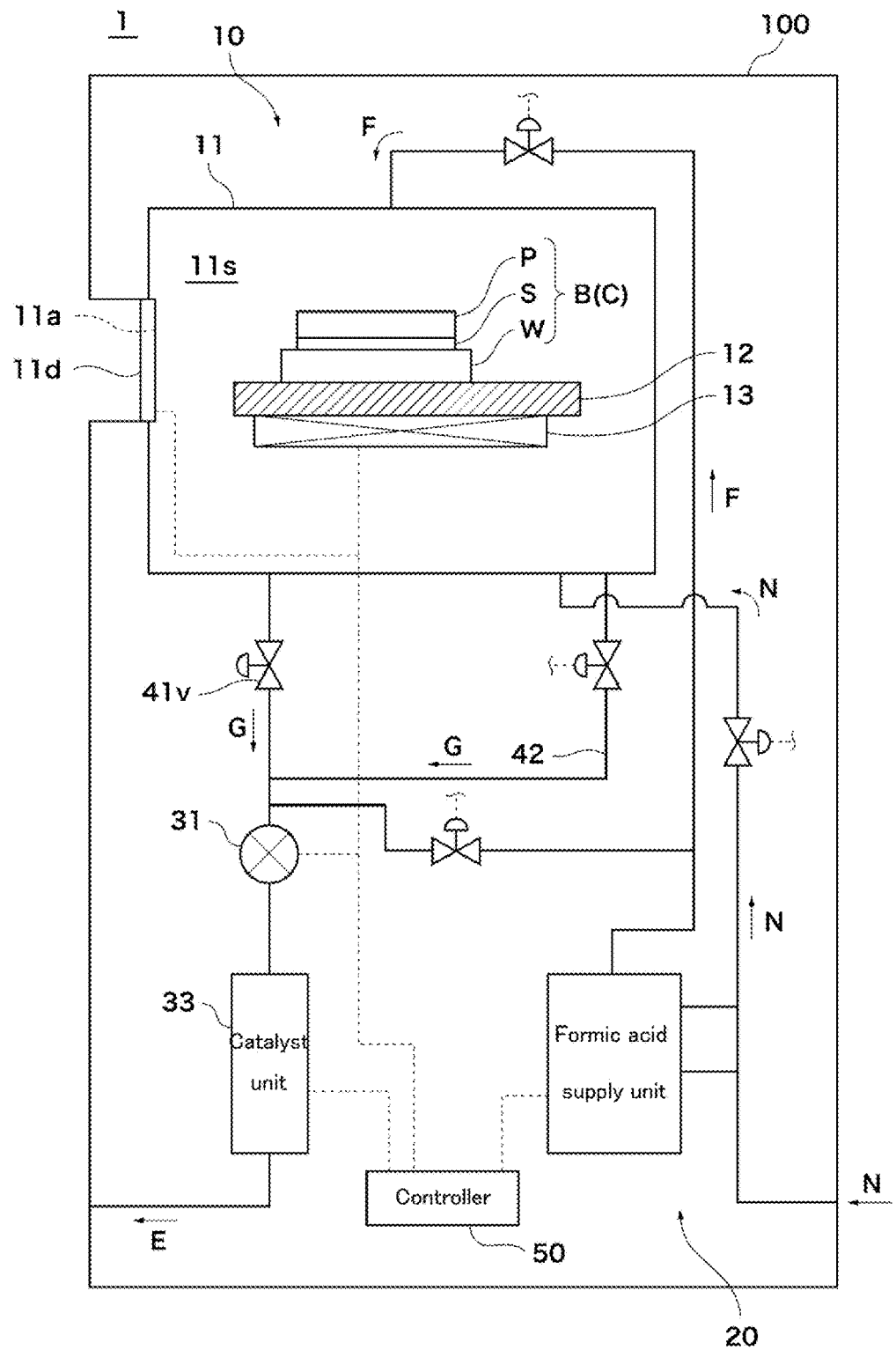
FIG. 3 is a general configuration diagram of a soldering apparatus 1.

In the following, description is made in FIGS. 2 and 3 using a substrate W, a solder paste S and an electronic component P as members to be bonded in place of the soldering target T and the solder paste S as shown in FIG. 3.

(1) Step of Providing Solder Paste

A step of providing a solder paste is a step of bringing the above solder paste for a reducing gas according to a first embodiment of the present invention into a usable state. This may be the production of the solder paste or the preparation of an already produced solder paste.

(2) Step of Applying Solder Paste

The solder paste is applied to a soldering target with a solder paste printer (or screen printer) or the like. Usually, printing is carried out using a mask (pattern) of a perforated metal plate with a thickness of about 30 to 300 μm called metal mask, for example, and a squeegee of the printer. A manual apparatus having a manually operated squeegee may be used. Application using a syringe may be employed.

(3) Step of Evaporating Solvent, Step of Reducing Members to be Bonded, and a Step of Melting Solder A step of evaporating the solvent, a step of reducing the members to be bonded, and a step of melting the solder are described in more detail using a soldering apparatus 1 shown in FIG. 3.

As soldering targets with the solder paste S applied, a substrate W and an electronic component P are used. As the reducing gas, a formic acid gas is used.

It should be noted that although the method for producing a soldered product as a second embodiment of the present invention is described together with the operation of the soldering apparatus 1 in the following description, the production method may be implemented by another apparatus.

Referring first to FIG. 3, the soldering apparatus 1 is described. FIG. 3 is a general configuration diagram of the soldering apparatus 1. The soldering apparatus 1 comprises: a treatment part 10 having a chamber 11 defining a treatment space 11s that is a space in which the members to be bonded are soldered to each other; a formic acid supply part 20 as a reducing gas supply part that supplies a formic acid gas F as a reducing gas to the chamber 11; a catalyst unit 33 as a reducing gas treatment part that reduces the formic acid concentration of the formic acid gas F in the soldering apparatus 1 before it is discharged; a controller 50 that controls the operation of the soldering apparatus 1; and a housing 100 that houses the treatment part 10, the formic acid supply part 20, the catalyst unit 33, and the controller 50.

The soldering apparatus 1 is an apparatus that bonds the substrate W and the electronic component P with the solder paste S. The substrate W and the electronic component P both have a metal portion on a surface thereof, and bonded so that the metal portions can be electrically conductive with each other via the solder. The substrate W and the electronic component P are transported into the chamber 11 with the solder paste S interposed therebetween, and the solder is melted in the chamber 11 to bond them. In the following, the substrate W, the solder paste S and the electronic component P stacked on top of each other with the solder still unmelted are referred to as "to-be-bonded members B", and the product obtained by bonding the substrate W and the electronic component P with molten solder is referred to as "soldered product C."

The chamber 11 is configured to make the treatment space 11s airtight by closing a carry-in/out port 11a with a shutter 11d. The material and shape of the chamber 11 are selected so that it can endure even when the pressure in the treatment space 11s is reduced to approximately 10 Pa (absolute pressure). In the chamber 11, a carrier plate 12 on which the to-be-bonded members B are placed, and a heater 13 for heating the carrier plate 12 are provided.

The heater 13 is configured to be able to heat the carrier plate 12 to a bonding temperature that is higher than the melting temperature of the solder.

The formic acid supply part 20 directs the formic acid gas F into the chamber 11. While the formic acid gas F is used as the reducing gas in this description, any gas that can reduce metal oxides formed on the surfaces to be bonded of the substrate W and the electronic component P, such as carboxylic acid gases other than the formic acid gas F, organic acid gases other than carboxylic acid gases, gases of organic compounds other than organic acids, and other reductive gases other than organic compounds, may be used. Examples of other reductive gases include a hydrogen gas. In this description, the formic acid gas F is used from the viewpoint of lowering the reduction temperature to below the melting temperature of the solder and the viewpoint of availability.

The catalyst unit 33 is a device that reduces the concentration of formic acid in the exhaust gas E discharged from the soldering apparatus 1 to such a level that the environment is not affected. The term "gas G" is a collective term for the gases discharged from the chamber 11.

A vacuum pump 31 is installed as a pressure reduction pump that discharges the gas G in the chamber 11 so that the pressure in the chamber 11 can be reduced to approximately 10 Pa (absolute pressure).

The controller 50 is configured to be able to open and close the shutter 11d. The controller 50 is also configured to be able to heat the carrier plate 12 by switching between on and off of the heater 13 and varying the output of the heater 13. The controller 50 is also configured to be able to supply the formic acid gas F toward the chamber 11. The controller 50 is also configured to be able to control the start and stop of the vacuum pump 31. In the controller 50, a sequence of operation of the soldering apparatus 1 (which is described later) is stored.

Figure 4:
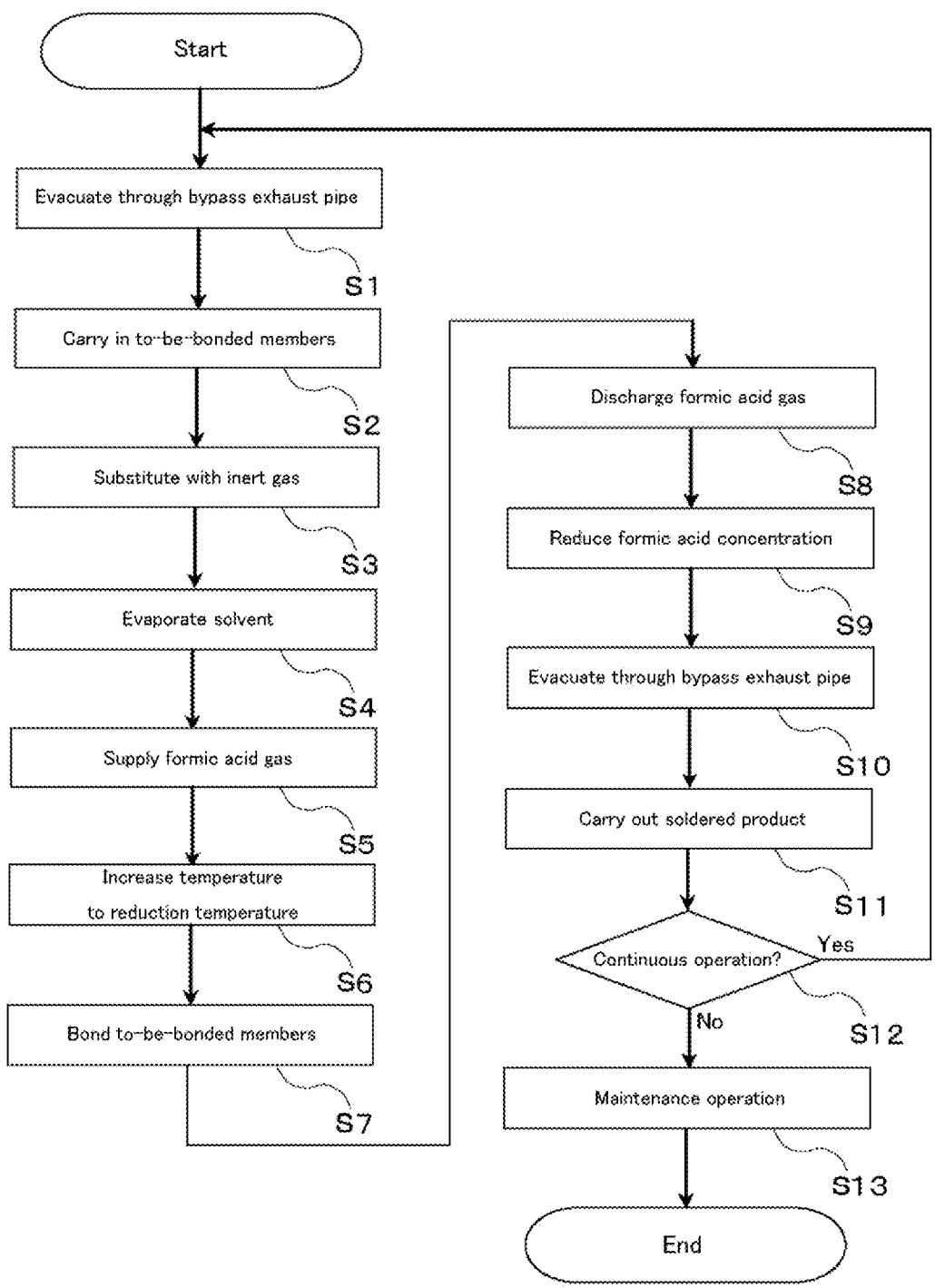
FIG. 4 is a flowchart, illustrating a solder bonding procedure using the soldering apparatus 1.

Referring continuously to FIG. 4, a method for producing a soldered product C according to an embodiment of the present invention is described. FIG. 4 is a flowchart illustrating a solder bonding procedure for the soldered product C. In the following description, when mention is made of the configuration of the soldering apparatus 1, reference is made to FIG. 3 as appropriate. It should be noted that a thixotropic agent having a melting point higher than the reduction temperature, in other words, a thixotropic agent that is solid at the reduction temperature, is used.

When a button (not shown) for opening the shutter 11d is pressed in order to carry the to-be-bonded members B into the soldering apparatus 1, the controller 50 activates the vacuum pump 31 to start discharge of the gas G in the chamber 11 (S1) before opening the shutter 11d. Then, the controller 50 moves the carrier plate 12 until most part of the carrier plate 12 is outside the chamber 11. By discharging the gas G in the chamber 11 from the chamber 11 before the shutter 11d is opened, the gas G in the chamber 11 can be prevented from flowing out of the soldering apparatus 1 through the carry-in/out port 11a when the shutter 11d is opened. After the shutter 11d is opened and most part of the carrier plate 12 is moved out of the chamber 11, the to-be-bonded members B are placed on the carrier plate 12. Then, as the carrier plate 12 is moved into the chamber 11, the to-be-bonded members B are carried into the chamber 11 (step of carrying in the to-be-bonded members: S2).

After the to-be-bonded members B are carried into the chamber 11, the controller 50 closes the shutter 11d to make the chamber 11 airtight. Then, in order to remove the atmosphere that has entered the chamber 11 while the shutter 11d was open and create an inert gas atmosphere, the controller 50 discharges the gas G in the chamber 11 and then introduces an inert gas N. By repeating this procedure, the oxygen concentration in the chamber 11 is reduced (step of substituting with an inert gas: S3). The oxygen concentration is preferably 5 ppm or lower. The inert gas N is a nitrogen gas, for example.

Next, the controller 50 turns on the heater 13 to increase the temperature of the carrier plate 12 or, more specifically, the temperature of the to-be-bonded members B to a temperature at which the solvent contained in the solder paste S vaporizes (evaporates) (S4). As the temperature increases to the vaporization temperature, the solvent evaporates and is removed from the solder paste S. In this embodiment, the pressure inside the chamber 11 may be reduced to a vacuum (reduced pressure) in order to accelerate the evaporation of the solvent.

While description is made of a case where the vaporization temperature is lower than the reduction temperature in this embodiment, the vaporization temperature may be equal to the following reduction temperature. When the vaporization temperature is equal to the reduction temperature, evaporation of a portion of the solvent and reduction of the to-be-bonded members occur simultaneously. In other words, there is a case where step (S4) and steps (S5) and (S6) as subsequent steps occur concurrently.

Next, the controller 50 supplies the formic acid gas F from the formic acid supply part 20 into the chamber 11 (S5) and keeps the heater 13 on to increase the temperature of the carrier plate 12 or, more specifically, the temperature of the to-be-bonded members B, to the reduction temperature (S6). The reduction temperature is the temperature at which the oxides on the to-be-bonded members B are reduced by formic acid. Here, in this embodiment, because the reduction temperature is lower than the melting temperatures of the solder powder and the thixotropic agent contained in the solder paste S, the solder powder and the thixotropic agent do not melt. Thus, the formic acid gas readily penetrates into the formed gaps and the oxide films can be favorably removed before the to-be-bonded members B are soldered to each other. When the formic acid gas F is supplied after a vacuum is created inside the chamber 11, the formic acid gas F readily penetrates into the gaps between the solder powder particles and the thixotropic agent particles. The step of supplying the formic acid gas F into the chamber 11 (S5) and the step of increasing the temperature of the to-be-bonded members B to the reduction temperature (S6) correspond to the reduction steps. The formic acid gas F may be supplied after the completion of temperature rise to the reduction temperature.

After the reduction steps (S5, S6), the output of the heater 13 is increased, with the atmosphere of the formic acid gas F in the chamber 11 maintained to increase the temperature of the carrier plate 12 or, more specifically, the temperature of the to-be-bonded members B, to the bonding temperature in order to melt the solder and solder-bond the to-be-bonded members B (bonding step: S7). The bonding temperature is any temperature higher than the melting temperature of the solder powder contained in the solder paste S, and is 30 to 50° C. higher than the melting temperature in this embodiment.

After the solder on the to-be-bonded members B is melted, the controller 50 turns off the heater 13. By starting cooling in this way, the temperature of the to-be-bonded members B decreases, and the solder solidifies when the temperature falls below its melting point. As a result, the soldered product C is obtained. At this time, the carrier plate 12 may be forcibly cooled to accelerate solidification of the solder. Then, the vacuum pump 31 is activated and a main exhaust valve 41v is opened to discharge the formic acid gas F from the chamber 11 (S8), and the inert gas N is introduced to return the pressure in the chamber 11 to normal pressure. The formic acid gas F discharged from the chamber 11 flows into the catalyst unit 33. The formic acid gas F is subjected to decomposition of the formic acid in the catalyst unit 33, and discharged from the soldering apparatus 1 as an exhaust gas E with a formic acid concentration reduced to a predetermined level or lower (S9). When the production of the soldered product C is completed, the controller 50 discharges the gas G in the chamber 11 through a bypass exhaust pipe 42 (S10), and opens the shutter 11d. As a result, the soldered product C can be taken out of the chamber 11 (S11).

When the soldered product C is carried out of the chamber 11, the controller 50 determines whether continuous operation is performed (S12). When continuous operation is performed, the procedure returns to the step of discharging the gas G in the chamber 11 (S1). When continuous operation is not performed, maintenance operation is performed (S13).

Figure 5:
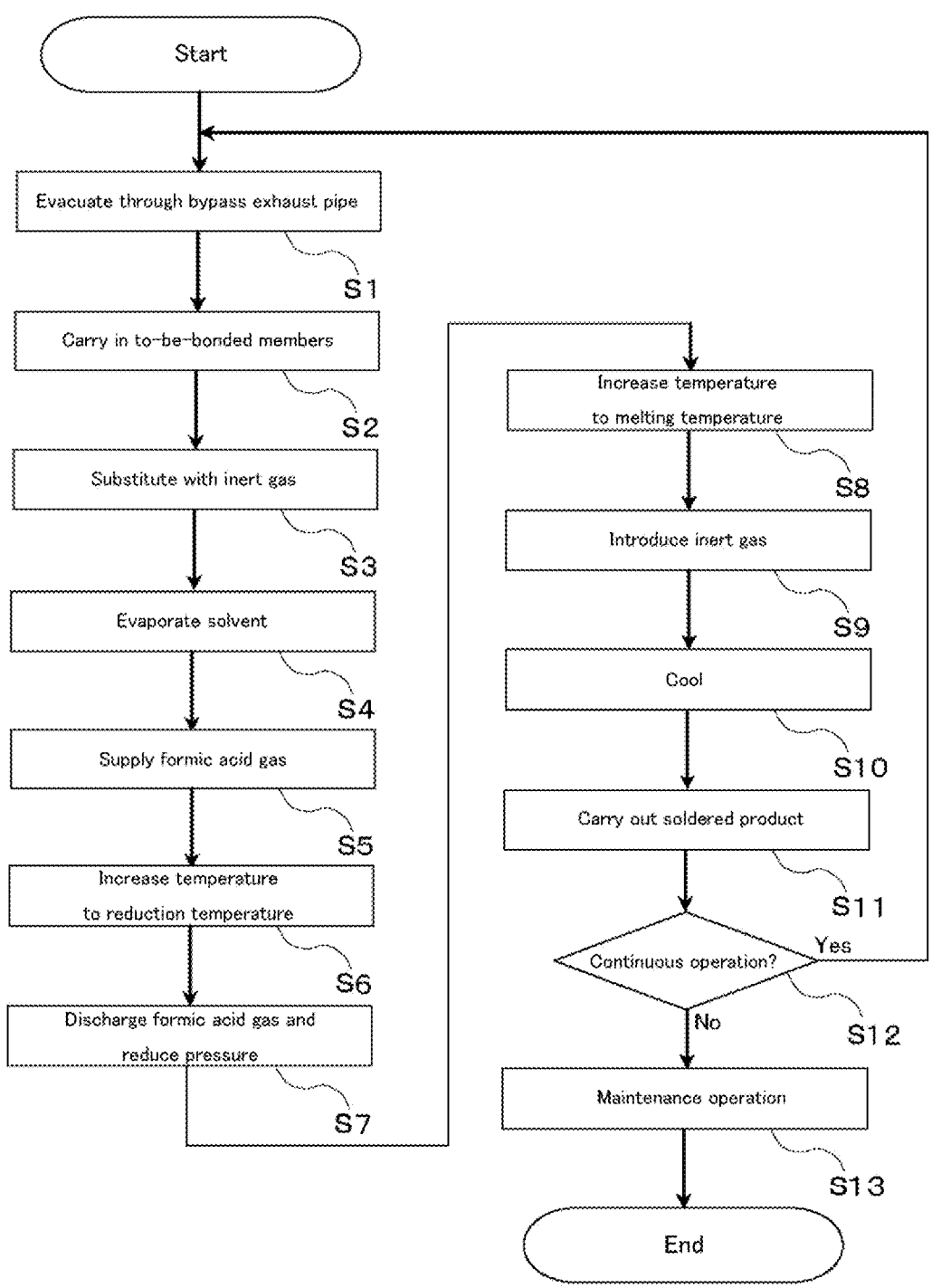
FIG. 5 is another flowchart, illustrating a solder bonding procedure using the soldering apparatus 1.

Referring to FIG. 5, another method for producing a soldered product C according to an embodiment of the present invention is described. FIG. 5 is a flowchart illustrating a solder bonding procedure for a soldered product C. In the following description, when mention is made of the configuration of the soldering apparatus 1, reference is made to FIG. 3 as appropriate.

Steps (S1) to (S6) are the same as those in the production method shown in FIG. 4.

After the completion of step (S6), the controller 50 activates the vacuum pump 31 and opens the main exhaust valve 41v to discharge the formic acid gas F from the chamber 11 and reduce the pressure in the chamber 11 (S7). With the reduced pressure (vacuum) in the chamber 11 maintained, the output of the heater 13 is increased to increase the temperature of the carrier plate 12 or, more specifically, the temperature of the to-be-bonded members B to the bonding temperature (S8) to melt the solder and solder-bond the to-be-bonded members B to each other. After the to-be-bonded members B are solder-bonded to each other, the controller 50 introduces an inert gas N to break the vacuum inside the chamber 11 (S9). The controller 50 turns off the heater 13 (starts cooling (S10)). Then, the temperature of the to-be-bonded members B decreases and the solder solidifies when the temperature falls below its melting point. As a result, the soldered product C is obtained. When the production of the soldered product C is completed, the controller 50 discharges the gas G in the chamber 11 via the bypass exhaust pipe 42 and opens the shutter 11d. As a result, the soldered product C can be taken out of the chamber 11 (S11).

Steps (S12) to (S13) are the same as those in the production method shown in FIG. 4.

When the inert gas N is introduced after the solder is melted as described above, cavities (voids) can be compressed and squashed. When the solder is solidified after the cavities are squashed, the decrease of fatigue life caused by voids in the solder can be further reduced.

As described above, according to the soldering apparatus 1, because the devices and units necessary to carry out solder bonding in a vacuum including the treatment part 10, the formic acid supply part 20, the catalyst unit 33 and the controller 50 are housed in the housing 100, solder bonding using the formic acid gas F can be accomplished appropriately and completely within the soldering apparatus 1. In addition, according to the method for producing a soldered product C according to this embodiment, appropriate vacuum soldering can be carried out using the solder paste S and the formic acid gas F.

While description is made using the substrate W and the electronic component P as to-be-bonded members together with the solder paste S in the above description, the to-be-bonded members may be members other than the substrate W and the electronic component P as long as they have a metal portion suitable for solder bonding on their surfaces.

While the to-be-bonded members B are heated in an atmosphere of the formic acid gas F to melt the solder paste S in the above description, the to-be-bonded members B may be heated in a vacuum (for example, about 100 Pa (absolute pressure)) to melt the solder paste S. When the to-be-bonded members B are melted in a vacuum, the treatment and discharge steps (S8, S9) are carried out after the reduction steps (S5, S6). When the chamber 11 contains almost no formic acid gas F when the shutter 11d is opened to take the soldered product C out of the chamber 11 (S11), the shutter 11d may be opened without creating a negative pressure in the chamber 11 (without activating the vacuum pump 31).

Because the solder paste for a reducing gas used in the present invention leaves less flux residue than conventional solder pastes, solder scattering can be reduced even when the to-be-bonded members B are bonded in a vacuum.

The method for producing a soldered product of the present application may further comprise a coating step of coating the soldering targets that have undergone solder bonding. Because the solder bonding according to the present invention generates almost no residue, no problem arises about the adhesion with a coating agent. Thus, the soldered portions are appropriately protected when coated in the coating step.

As described above, the present invention allows the use of a solder paste with a simpler composition and makes it possible to achieve reduction of oxidized metals and improvement reducibility as well as improvement of meltability, which are conventionally achieved by the use of a reducing agent and an activator, with introduction of a reducing gas and vacuum on the apparatus side.

EXAMPLES

Next, examples of the present invention are described together with comparative examples. It should be noted that the present invention is not construed as being limited by the following examples.

[1. Melting Point of Thixotropic Agent]

In the following examples, the relationship among the melting point of the thixotropic agent, the melting point of the solder and the reduction temperature is shown.

[Materials]

Solder powder
  A: Sn-3Ag-0.5Cu (abbreviation SAC305), melting point about 220° C.
Thixotropic agent
  A: Polyamide-based thixotropic agent, melting point 255° C.
  B: Amide-based thixotropic agent, melting point 185° C.
  C: Hardened castor oil, melting point 30° C.
  D: Amide-based thixotropic agent, melting point 130° C.
  E: Amide-based thixotropic agent, melting point 150° C.
  F: Sorbitol-based thixotropic agent, melting point 180° C.
  G: Amide-based thixotropic agent, melting point 80° C.

Solvent
  A: Hexyl diglycol (HeDG, diethylene glycol monohexyl ether)
  B: Phenyl diglycol
  C: 2-Ethylhexyl diglycol
  D: 2-Ethyl-1,3-hexanediol
  E: Diglyceryl tetraisostearate+HeDG 1:1 mixture

[Preparation of Solder Paste for Reducing Gas]

Examples 1 to 4

Solder pastes of Examples 1 to 4 were each prepared by mixing and stirring 90% by mass of a lead-free solder alloy powder (Sn:Ag:Cu=96.5:3.0:0.5 (% by mass)), 1% by mass of a thixotropic agent and 9% by mass of a solvent.

Examples 5 to 7

Solder pastes of Examples 5 to 7 were each prepared by mixing and stirring 90% by mass of a lead-free solder alloy powder (Sn:Ag:Cu=96.5:3.0:0.5 (% by mass)), 2% by mass of a thixotropic agent (thixotropic agent doubled) and 8% by mass of a solvent.

Example 8

A solder paste of Example 8 was prepared by mixing and stirring 90% by mass of a lead-free solder alloy powder (Sn:Ag:Cu=96.5:3.0:0.5 (% by mass)), 0.15% by mass of a thixotropic agent (thixotropic agent reduced by 85%) and 9.85% by mass of a solvent.

Example 9

A solder paste of Example 9 was mixing and stirring 90% by mass of a lead-free solder alloy powder (Sn:Ag:Cu=96.5:3.0:0.5 (% by mass)), 2% by mass of a thixotropic agent (thixotropic agent doubled) and 8% by mass of a solvent.

Examples 10 to 12

Solder pastes of Examples 10 to 12 were each prepared by mixing and stirring 90% by mass of a lead-free solder alloy powder (Sn:Ag:Cu=96.5:3.0:0.5 (% by mass)), 1% by mass of a thixotropic agent and 9% by mass of a solvent.

Comparative Examples 1 and 2

Solder pastes of Comparative Examples 1 and 2 were each prepared by mixing and stirring 90% by mass of a lead-free solder alloy powder (Sn:Ag:Cu=96.5:3.0:0.5 (% by mass)), 1% by mass of a thixotropic agent and 9% by mass of a solvent.

[Preparation of Test Pieces]

Nickel-plated copper substrates (20×20 mm, thickness 2 mm) were prepared as test pieces, and the solder pastes of Examples and Comparative Examples were applied to a thickness (metal mask thickness) of 150 μm in a 10×12 mm sized region on a surface of each substrate.

[Reflow Conditions]

Figure 6:
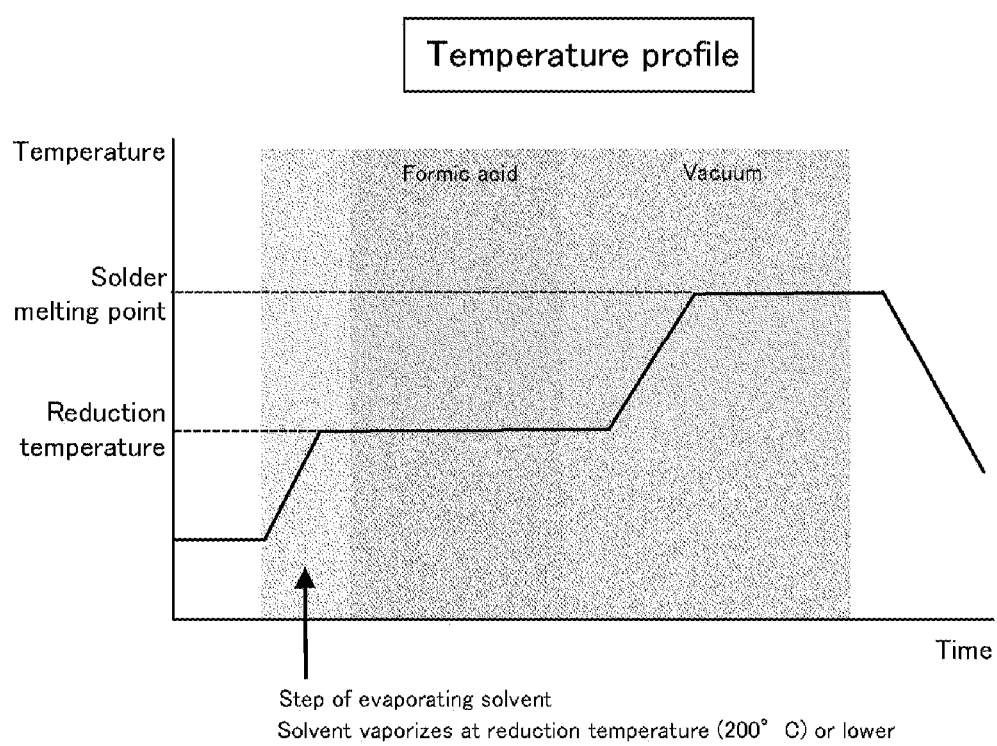
FIG. 6 is a graph, showing a temperature profile during reflow.

The reflow conditions are as shown in the "Temperature profile" in FIG. 6.

Preliminary heating 1 (solvent evaporation step): Nitrogen atmosphere (atmospheric pressure) 200° C. or lower Preliminary heating 2 (reduction step): Formic acid+ nitrogen atmosphere (atmospheric pressure, formic acid concentration 3% Vol), 200° C., 60 seconds Main heating (solder melting step): Vacuum atmosphere (200 Pa), peak temperature 260° C., 220° C. or higher, heating time 30 seconds

[Determination of Solder Wettability]

Figure 7:
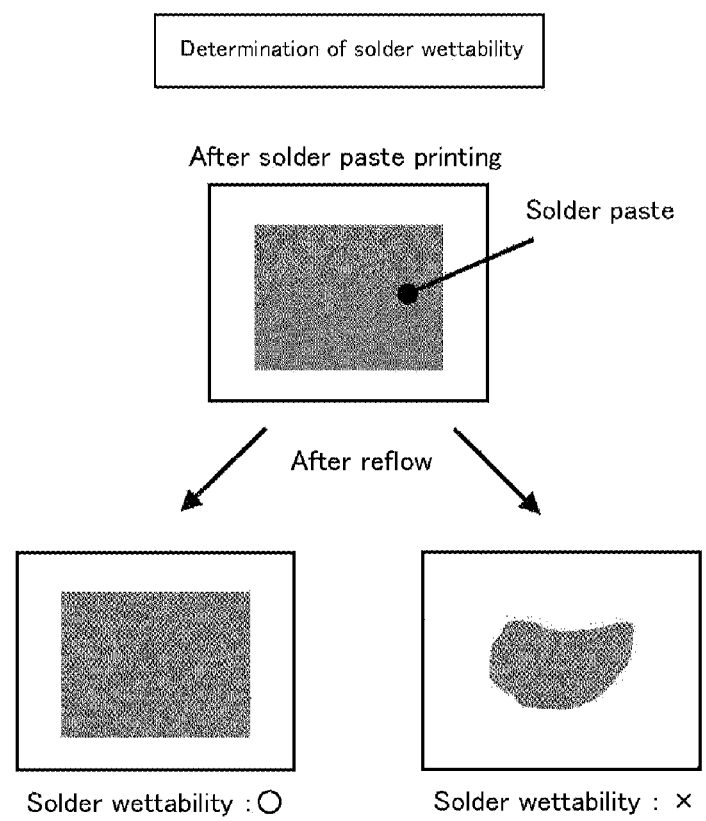
FIG. 7 is a diagram, showing determination of solder wettability.

As shown in "Determination of solder wettability" in FIG. 7, the presence or absence of dewetting was checked after the substrate with the solder paste printed thereon was heated under the reflow conditions. The checking method is as follows: the soldered portion of each substrate was visually observed, and the substrates on which the underlying substrate was completely wet with the solder and states such as repelling were not observed and the substrates on which states such as repelling were slightly observed were rated as "Dewetting not observed (solder wettability: ○)", and the substrates on which repelling or the like were clearly observed were rated as "Dewetting observed (solder wettability: x)."

[Determination of Heat Sag of Thixotropic Agent]

For a paste prepared by removing the solder powder from the solder paste of each Example, the wet-spreading area rate of the paste was measured by the above procedures (1) to (5).

TABLE 1

Melting point of thixotropic agent and evaluation of solder wettability

Figure 8:
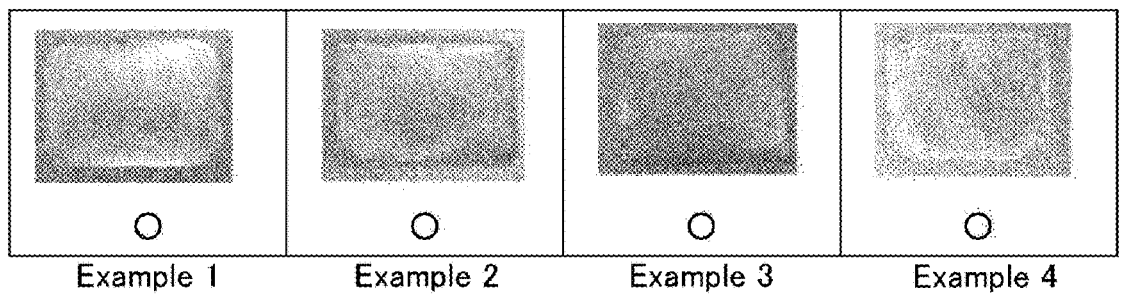
FIG. 8 shows appearance photographs in determination of solder wettability in Examples 1 to 4.

|  | Example 1 | Example 2 | Example 3 | Example 4 |
|---|---|---|---|---|
| Solder powder (90% by mass) | A | A | A | A |
| Thixotropic agent (1.0% by mass) | A | B | B | B |
| Solvent (9.0% by mass) | A | B | C | E |
| Melting point of solder | 220 | 220 | 220 | 220 |
| Reduction temperature | 200 | 200 | 200 | 200 |
| Melting point of thixotropic agent | 255 | 185 | 185 | 185 |
| Solder wettability (refer to FIG. 8) | ○ | ○ | ○ | ○ |
| Heat sag of thixotropic agent at melting point | — | 27% | 27% | 27% |
| Heat sag of thixotropic agent at reduction temperature | <1% | 41% | 41% | 41% |

TABLE 2

Melting point of thixotropic agent and evaluation of solder wettability

Figure 9:
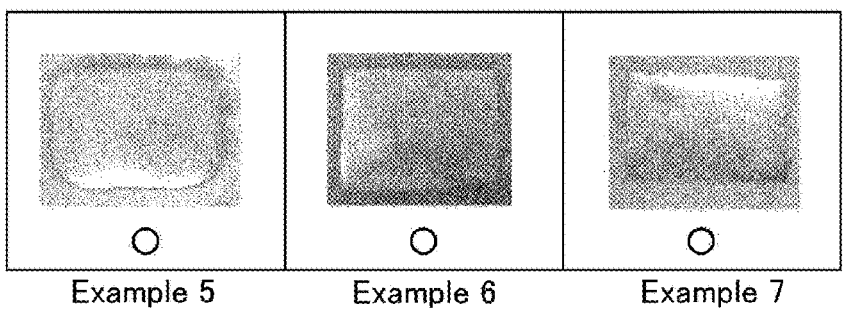
FIG. 9 shows appearance photographs in determination of solder wettability in Examples 5 to 7.

|  | Example 5 | Example 6 | Example 7 |
|---|---|---|---|
| Solder powder (90% by mass) | A | A | A |
| Thixotropic agent (2.0% by mass) | B | B | B |
| Solvent (8.0% by mass) | B | C | E |
| Melting point of solder | 220 | 220 | 220 |
| Reduction temperature | 200 | 200 | 200 |
| Melting point of thixotropic agent | 185 | 185 | 185 |
| Solder wettability (refer to FIG. 9) | ○ | ○ | ○ |

TABLE 3

Melting point of thixotropic agent and evaluation of solder wettability

Figure 10:
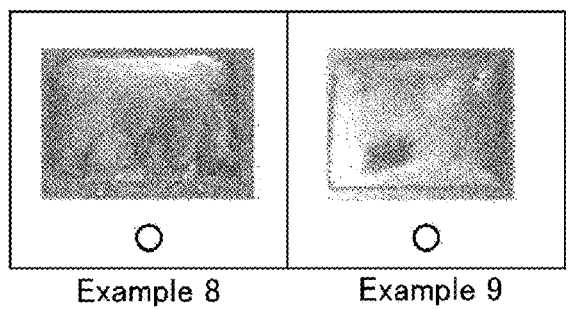
FIG. 10 shows appearance photographs in determination of solder wettability in Examples 8 and 9.

|  | Example 8 | Example 9 |
|---|---|---|
| Solder powder (90% by mass) | A | A |
| Thixotropic agent | B (decreased) | B (increased) |
| Solvent | A | A |
| Melting point of solder | 220 | 220 |
| Reduction temperature | 200 | 200 |
| Melting point of thixotropic agent | 185 | 185 |
| Solder wettability (refer to FIG. 10) | ○ | ○ |

TABLE 4

Melting point of thixotropic agent and evaluation of solder wettability

Figure 11:
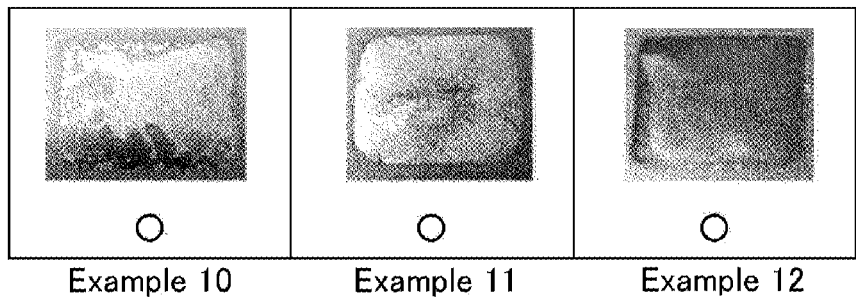
FIG. 11 shows appearance photographs in determination of solder wettability in Examples 10 to 12.

|  | Example 10 | Example 11 | Example 12 |
|---|---|---|---|
| Solder powder | A | A | A |
| Thixotropic agent | E | D | G |
| Solvent | A | A | A |
| Melting point of solder | 220 | 220 | 220 |
| Reduction temperature | 200 | 200 | 200 |
| Melting point of thixotropic agent | 150 | 130 | 80 |
| Solder wettability (refer to FIG. 11) | ○ | ○ | ○ |

TABLE 5

Melting point of thixotropic agent and evaluation of solder wettability

Figure 12:
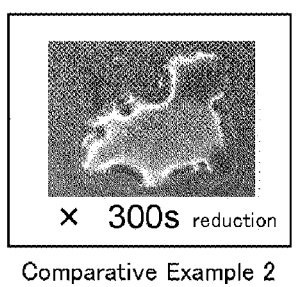
FIG. 12 shows an appearance photograph in determination of solder wettability in Comparative Example 2.

|  | Comparative Example 1 | Comparative Example 2 |
|---|---|---|
| Solder powder (90% by mass) | A | A |
| Thixotropic agent (1.0% by mass) | C | F |
| Solvent (9.0% by mass) | A | A |
| Melting point of solder | 220 | 220 |
| Reduction temperature | 200 | 200 |
| Melting point of thixotropic agent | 30 | 180 |
| Solder wettability (refer to FIG. 12) | x | x |
| Heat sag of thixotropic agent at its melting point | 51% | — |
| Heat sag of thixotropic agent at reduction temperature | 60% | 51% |

The "melting point" above refers to the temperature at which the substance melts regardless of the gas pressure.

As shown above, in Example 1, in which the thixotropic agent did not melt at the reduction temperature, the solder wettability was good even after reflow. In Examples 2 to 12, in which the melting point of the thixotropic agent was lower than the reduction temperature, it is believed that the solder wettability was good because the thixotropic agent, which melted at the reduction temperature but wet-spread narrowly, allowed the reducing gas to exert its reduction effect sufficiently. A decrease in wettability hinders soldering with sufficient strength. The results in Comparative Examples 1 and 2 were believed to be because the surface of the base material was covered because of heat sag of molten thixotropic agent (wet-spreading) and the base material and a portion of the solder powder were insufficiently reduced.

[2. Components of Solder Paste]

In the following examples, a component composition necessary for the solder paste of the present invention to exert its effect is shown.

[Materials]
Solder powder
A: Sn-3Ag-0.5Cu (abbreviation SAC305), melting point about 220° C.
Thixotropic agent
A: polyamide-based thixotropic agent, melting point 255° C.
B: Amide-based thixotropic agent, melting point 185° C.
Solvent
A: Hexyl diglycol
B: Phenyl diglycol
C: 2-Ethylhexyl diglycol
Activator: Succinic acid, salicylic acid
Rosin: Acrylic acid modified rosin (KE-604 manufactured by Arakawa Chemical Industries, Ltd.)

[Preparation of Solder Paste for Reducing Gas]

Example 21

A solder paste was prepared by mixing a flux obtained by mixing a thixotropic agent having a melting point of 255° C. and hexyl diglycol with an SAC305 alloy powder having a solder melting point of 220° C.

Example 22

A solder paste was prepared by mixing a flux obtained by mixing a thixotropic agent having a melting point of 185° C. and phenyl diglycol with an SAC305 alloy powder having a solder melting point of 220° C.

Example 23

A solder paste was prepared by mixing a flux obtained by mixing a thixotropic agent having a melting point of 185° C. and 2-ethylhexyl diglycol with an SAC305 alloy powder having a solder melting point of 220° C.

Comparative Example 21

A solder paste was prepared by mixing a flux obtained by mixing a thixotropic agent having a melting point of 255° C., hexyl diglycol, and succinic acid and salicylic acid as activators with an SAC305 alloy powder having a solder melting point of 220° C.

Comparative Example 22

A commercially available solder paste of an SAC305 alloy powder with a solder melting point of 220° C. that contains a thixotropic agent having a melting point of 255° C. and hexyl diglycol was used. This commercially available solder paste contains an activator and rosin.

Reference Example 21

A solder paste was prepared by mixing a flux obtained by mixing a thixotropic agent having a melting point of 255° C. and hexyl diglycol with an SAC305 alloy powder having a solder melting point of 220° C. The prepared solder paste was used in normal reflow.

Reference Example 22

A commercially available solder paste of an SAC305 alloy powder with solder melting point of 220° C. that contains a thixotropic agent having a melting point of 255° C. and hexyl diglycol was used. This commercially available solder paste contains an activator and rosin. The prepared solder paste was used in normal reflow.

[Preparation of Test Pieces]

Nickel-plated copper substrates (20×20 mm, thickness 2 mm) were prepared as test pieces, and the solder pastes of Examples and Comparative Examples were applied to a thickness (metal mask thickness) of 150 μm in a 10×12 mm sized region on a surface of each substrate.

[Reflow Conditions]

The reflow conditions are as shown in the "Temperature profile" in FIG. 6.

Preliminary heating 1 (solvent evaporation step): Nitrogen atmosphere (atmospheric pressure) 200° C. or lower Preliminary heating 2 (reduction step): Formic acid+nitrogen atmosphere (vacuum atmosphere (200 Pa), formic acid concentration 3% Vol), 180° C., 60 seconds Main heating (solder melting step): Vacuum atmosphere (200 Pa), peak temperature 260° C., 220° C. or higher, heating time 30 seconds

[Normal Reflow Conditions]

The reflow conditions were as follows: soldering was carried out in a nitrogen atmosphere (atmospheric pressure) according to the "Temperature profile" in FIG. 6. The nitrogen atmosphere was consistent throughout the preliminary heatings 1 and 2 and the main heating.

Preliminary heating 1 (solvent evaporation step): nitrogen atmosphere (atmospheric pressure) 200° C. or lower Preliminary heating 2 (reduction step): nitrogen atmosphere (atmospheric pressure) 180° C., 60 seconds Main heating (solder melting step): nitrogen atmosphere (atmospheric pressure), peak temperature 260° C., 220° C.

[Determination of Solder Wettability]

As shown in "Determination of solder wettability" in FIG. 7, the presence or absence of dewetting was checked after the substrate with the solder paste printed thereon was heated under the reflow conditions. The checking method is as follows: the soldered portion of each substrate was visually observed, and the substrates on which the underlying substrate was completely wet with the solder and states such as repelling were not observed and the substrates on which states such as repelling were slightly observed were rated as "Dewetting not observed (solder wettability: ○)", and the substrates on which repelling or the like were clearly observed were rated as "Dewetting observed (solder wettability: x)."

TABLE 6

Contained components (% by mass) and evaluation of solder wettability

|  |  | Example 21 | Example 22 | Example 23 | Compar. Ex. 21 | Compar. Ex. 22 | Ref. Ex. 21 | Ref. Ex. 22 |
| --- | --- | --- | --- | --- | --- | --- | --- | --- |
| Solder powder | A | 90.0 | 91.5 | 91.5 | 89.0 | 90.0 | 90.0 | 90.0 |
| Thixotropic | A | 1.0 | — | — | 1 | 0.5 | 0.5 | 0.5 |
| agent | B | — | 0.5 | 0.5 | — | — | — | — |

TABLE 6-continued

Contained components (% by mass) and evaluation of solder wettability

|  |  | Example 21 | Example 22 | Example 23 | Compar. Ex. 21 | Compar. Ex. 22 | Ref. Ex. 21 | Ref. Ex. 22 |
|---|---|---|---|---|---|---|---|---|
| Solvent | A | 9.0 | — | — | 9 | 5 | 5 | 5 |
|  | B | — | 8.0 | — | — | — | — | — |
|  | C | — | — | 8.0 | — | — | — | — |
| Activator |  | 0 | 0 | 0 | 1 | 1 | 0 | 1 |
| Rosin |  | 0 | 0 | 0 | 0 | 4 | 0 | 4 |
| Formic acid reduction (reflow furnace) |  | Involved (reduction furnace) | Involved (reduction furnace) | Involved (reduction furnace) | Involved (reduction furnace) | Involved (reduction furnace) | Not involved (normal reflow) | Not involved (normal reflow) |
| Solder wettability |  | ○ | ○ | ○ | x | x | x | ○ |
| Viscosity (Pa · s) |  | 220 | 230 | 200 | 200 | 120 | 80 | 120 |

In Examples 21 to 23, because the solvent was volatilized completely at the reduction temperature 200° C., the formic acid readily penetrated into and reduced the solder powder. Thus, good wettability was achieved.

In Comparative Examples 21 and 22, the solder wettability was lowered after the reflow. This is believed to be because the activator reacted with the formic acid and inhibited the effect of the formic acid.

In Reference Example 21, soldering with the composition of Example 21 was attempted in a normal reflow furnace, but the solder powder did not melt. In Reference Example 22, soldering with the solder paste composition of Comparative Example 22 (commercially available product) was attempted in a normal reflow furnace and good wettability was observed. As described above, the composition of Example 21 has no practical use in a normal reflow environment but exhibits a very high effect in a formic acid reflow environment.

[3. Method]

In the following examples, a method necessary for the solder paste of the present invention to exert its effect is shown.

[Materials]
Solder powder
A: Sn-3Ag-0.5Cu (abbreviation SAC305), melting point about 220° C.
B: Sn-5Sb, melting point about 240° C.
Thixotropic agent
A: Polyamide-based thixotropic agent, melting point 255° C.
B: Amide-based thixotropic agent, melting point 185° C.
C: Hardened castor oil, melting point 30° C.
D: Amide-based thixotropic agent, melting point 130° C.
E: Amide-based thixotropic agent, melting point 150° C.
F: Sorbitol-based thixotropic agent, melting point 180° C.
Solvent A: Hexyl diglycol (HeDG)
B: Phenyl diglycol
C: 2-Ethylhexyl diglycol
D: 2-Ethyl-1,3-hexanediol
E: Diglyceryl tetraisostearate+HeDG 1:1 mixture

[Preparation of Solder Paste for Reducing Gas]

Example 31

A solder paste was prepared by mixing a flux obtained by mixing a thixotropic agent having a melting point of 255° C. and hexyl diglycol with an SAC305 alloy powder having a solder melting point of 220° C. Hexyl diglycol showed a weight loss of 100% in TG (differential scanning calorimeter) at 200° C. The reduction temperature was 200° C.

Example 32

A solder paste was prepared by mixing a flux obtained by mixing a thixotropic agent having a melting point of 185° C. and phenyl diglycol with an SAC305 alloy powder having a solder melting point of 220° C. Phenyl diglycol showed a weight loss of 28% in TG (differential scanning calorimeter) at 180° C.

Example 33

A solder paste was prepared by mixing a flux obtained by mixing a thixotropic agent having a melting point of 185° C. and 2-ethylhexyl diglycol with an SAC305 alloy powder having a solder melting point of 220° C. 2-Ethylhexyl diglycol showed a weight loss of 47% in TG (differential scanning calorimeter) at 180° C.

Example 34

A solder paste was prepared by mixing a flux obtained by mixing a thixotropic agent having a melting point of 185° C. and 2-ethyl-1,3-hexanediol with an SAC305 alloy powder having a solder melting point of 220° C. 2-Ethyl-1,3-hexanediol showed a weight loss of 52% in TG (differential scanning calorimeter) at 180° C.

Example 35

A solder paste was prepared by mixing a flux obtained by mixing a thixotropic agent having a melting point of 255° C. and hexyl diglycol with a Sn-5Sb alloy powder having a solder melting point of 240° C. Hexyl diglycol showed a weight loss of 78% in TG (differential scanning calorimeter) at 180° C.

Example 36

A solder paste was prepared by mixing a flux obtained by mixing a thixotropic agent having a melting point of 130° C. and hexyl diglycol with an SAC305 alloy powder having a solder melting point of 220° C.

Example 37

A solder paste was prepared by mixing a flux obtained by mixing a thixotropic agent having a melting point of 150° C. and hexyl diglycol with an SAC305 alloy powder having a solder melting point of 220° C.

Comparative Example 31

A solder paste was prepared by mixing a flux obtained by mixing a thixotropic agent having a melting point of 30° C. and hexyl diglycol with an SAC305 alloy powder having a solder melting point of 220° C.

Comparative Example 32

A solder paste was prepared by mixing a flux obtained by mixing a thixotropic agent having a melting point of 180° C. and hexyl diglycol with an SAC305 alloy powder having a solder melting point of 220° C.

[Preparation of Test Pieces]

Nickel-plated copper substrates (20×20 mm, thickness 2 mm) were prepared as test pieces, and the solder pastes of Examples and Comparative Examples were applied to a thickness (metal mask thickness) of 150 μm in a 10×12 mm sized region on a surface of each substrate.

[Reflow Conditions]

The reflow conditions are as shown in the "Temperature profile" in FIG. 6.

Preliminary heating 1 (solvent evaporation step): Nitrogen atmosphere (atmospheric pressure) 200° C. or lower Preliminary heating 2 (reduction step): Formic acid+nitrogen atmosphere (atmospheric pressure, formic acid concentration 3% Vol), 200° C., 60 seconds Main heating (solder melting step): Vacuum atmosphere (200 Pa), peak temperature 260° C., 220° C. or higher, heating time 30 seconds

[Determination of Solder Wettability]

As shown in "Determination of solder wettability" in FIG. 7, the presence or absence of dewetting was checked after the substrate with the solder paste printed thereon was heated under the reflow conditions. The checking method is as follows: the soldered portion of each substrate was visually observed, and the substrates on which the underlying substrate was completely wet with the solder and states such as repelling were not observed and the substrates on which states such as repelling were slightly observed were rated as "Dewetting not observed (solder wettability: ○)", and the substrates on which repelling or the like were clearly observed were rated as "Dewetting observed (solder wettability: x)."

TABLE 7

Contained components and evaluation of solder wettability

| | Example 31 | Example 32 | Example 33 | Example 34 | Example 35 |
|---|---|---|---|---|---|
| Solder powder (90% by mass) | A | A | A | A | B |
| Thixotropic agent (1.0% by mass) | A | B | B | B | A |
| Solvent (9.0% by mass) | A | B | C | D | A |
| Melting point of solder | 220 | 220 | 220 | 220 | 240 |
| Reduction temperature | 200 | 180 | 180 | 180 | 200 |
| Melting point of thixotropic agent | 255 | 185 | 185 | 185 | 255 |
| Solvent volatilization volume at 200° C. (normal pressure) | 100% | 67% | 96% | 100% | 100% |
| Solvent volatilization volume at 180° C. (normal pressure) | 78% | 28% | 47% | 52% | 78% |
| Solder wettability | ○ | ○ | ○ | ○ | ○ |

TABLE 8

Contained components and evaluation of solder wettability

| | Example 36 | Example 37 | Compar. Ex. 31 | Compar. Ex. 32 |
|---|---|---|---|---|
| Solder powder (90% by mass) | A | A | A | A |
| Thixotropic agent (1.0% by mass) | D | E | C | F |
| Solvent (9.0% by mass) | A | A | A | A |
| Melting point of solder | 220 | 220 | 220 | 220 |
| Reduction temperature | 200 | 200 | 200 | 200 |
| Melting point of thixotropic agent | 130 | 150 | 30 | 180 |
| Solvent volatilization volume at 180° C. (normal pressure) | 78% | 78% | 78% | 78% |
| Solder wettability | ○ | ○ | x | x |

In Example 31, reduction was carried out at a temperature lower than the melting point of the thixotropic agent 255° C., and the solvent was completely volatilized at the reduction temperature 200° C. Because formic acid readily penetrated into and reduced the solder powder, good wettability was achieved.

In Example 32, the reduction temperature 180° C. was lower than the melting point of the thixotropic agent 185° C. Although phenyl diglycol shows a weight loss of 28% at the reduction temperature 180° C. under normal pressure, the solvent had been completely volatilized when formic acid was introduced because the pressure had been reduced to 200 Pa. Because formic acid readily penetrated into and reduced the solder powder, good wettability was achieved.

Example 33 is similar to Example 32. Although 2-ethylhexyl diglycol shows a weight loss of 47% at the reduction temperature 180° C. under normal pressure, the solvent had been completely volatilized when formic acid was introduced as in the case of Example 32. Because formic acid readily penetrated and reduced the solder powder, good wettability was achieved.

Example 34 is also similar to Examples 32 and 33. Although 2-ethyl-1,3-hexanediol shows a weight loss of 52% at the reduction temperature 180° C. under normal pressure, the solvent had been completely volatilized when the formic acid was introduced as in the case of Examples 32 and 33. Because formic acid readily penetrated into and reduced the solder powder, good wettability was achieved.

In Example 35, the flux and the reduction conditions were the same as those of Example 31 but Sn-5Sb was used as the solder powder. Even when Sn-5Sb was used as the solder powder, the solder powder was reduced by formic acid and exhibited good wettability.

In Examples 36 and 37, in which the thixotropic agent was melted at the reduction temperature, good solder wettability was achieved after reflow. This is believed to be because the thixotropic agent melted but spread so narrowly that reduction of the base material and the solder powder was not inhibited.

In Comparative Examples 31 and 32, in which the thixotropic agent was melted at the reduction temperature, the solder wettability was poor after reflow. A decrease in wettability hinders soldering with sufficient strength. This is believed to be because appropriate gaps were not formed due to melting of the thixotropic agent and the molten thixotropic agent covered the surface of the base material and caused insufficient reduction of the base material and a portion of the solder powder.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1 soldering apparatus
11 chamber
11s treatment space
20 formic acid supply part
31 vacuum pump
33 catalyst unit
41v main exhaust valve
42 bypass exhaust pipe
50 controller
100 housing
C soldered product
B to-be-bonded members
F reducing gas, formic acid gas
G gas
M pattern, metal mask
N inert gas
P electronic component
Q squeegee
S', S solder paste
T soldering target
W substrate

The invention claimed is:

1. A solder paste for use with a reducing gas during soldering, essentially consisting of:
   a solder powder;
   a thixotropic agent that is solid at normal temperature, wherein the thixotropic agent is one or more of: a compound containing an amide bond, a compound containing an polyamide obtained by condensation polymerization of a diamine with a dicarboxylic acid, sorbitol, a benzylidene sorbitol, hardened castor oil, beeswax and carnauba wax; and
   a solvent for dispersing the solder powder and thixotropic agent, imparting a structural viscosity to gelate the solder paste, and allowing viscosity adjustment;
   wherein the solder paste is free of reducing agents for removal of oxide films and free of activators for improvement of reducibility,
   wherein the solder powder and the thixotropic agent melt at a temperature higher than the temperature for reduction with the reducing gas;
   when the reducing gas is formic acid or hydrogen, and
   wherein the solvent shows a weight loss of 25% or more at a rate of temperature increase of 10° C./min in thermogravimetry (TG) under normal pressure at 180° C.

2. A solder paste for use with a reducing gas during soldering, essentially consisting of:
   a solder powder;
   a thixotropic agent that is solid at normal temperature, wherein the thixotropic agent is one or more of: a compound containing an amide bond, a compound containing an polyamide obtained by condensation polymerization of a diamine with a dicarboxylic acid, sorbitol, a benzylidene sorbitol, hardened castor oil, beeswax and carnauba wax; and
   a solvent for dispersing the solder powder and thixotropic agent, imparting a structural viscosity to gelate the solder paste, and allowing viscosity adjustment;
   wherein the solder paste is free of reducing agents for removal of oxide films and free of activators for improvement of reducibility,
   wherein the thixotropic agent is a thixotropic agent determined to have a wet-spreading area rate of 0 to 50% by the following procedures (1) to (5),
   (1) Applying a paste obtained by removing the solder powder from the solder paste consisting of the solder powder, the thixotropic agent and the solvent to a thickness of 100 μm (metal mask thickness) in a 5×5 mm sized region on a nickel-plated copper substrate (20×20 mm, thickness 2 mm);
   (2) Measuring the area of the paste one minute after the applying;
   (3) Placing the copper substrate on a hot plate at normal temperature and heating the copper substrate until the copper substrate reaches a predetermined temperature;
   (4) Removing the copper substrate from the hot plate when the predetermined temperature is reached and cooling the copper substrate; and
   (5) Measuring the area of the paste on the copper substrate after the cooling;
   where the predetermined temperature in the procedure (3) is a melting point of the thixotropic agent under normal pressure, and
   wherein the solvent shows a weight loss of 25% or more at a rate of temperature increase of 10° C./min in thermogravimetry (TG) under normal pressure at 180° C.

3. The solder paste for use with a reducing gas according to claim 2,
wherein the solder powder and the thixotropic agent melt at a temperature higher than the temperature for reduction with the reducing gas when the reducing gas is formic acid or hydrogen.

4. The solder paste for use with a reducing gas according to claim 1,
wherein the thixotropic agent is an amide-based thixotropic agent.

5. The solder paste for use with a reducing gas during soldering, essentially consisting of:
a solder powder;
a thixotropic agent that is solid at normal temperature, wherein the thixotropic agent is one or more of: a compound containing an amide bond, a compound containing an polyamide obtained by condensation polymerization of a diamine with a dicarboxylic acid, sorbitol, a benzylidene sorbitol, hardened castor oil, beeswax and carnauba wax; and
a solvent for dispersing the solder powder and thixotropic agent, imparting a structural viscosity to gelate the solder paste, and allowing viscosity adjustment;
wherein the solder paste is free of reducing agents for removal of oxide films and free of activators for improvement of reducibility,
wherein the thixotropic agent is a thixotropic agent determined to have a wet-spreading area rate of 0 to 50% by the following procedures (1) to (5),
(1) Applying a paste obtained by removing the solder powder from the solder paste consisting of the solder powder, the thixotropic agent and the solvent to a thickness of 100 μm (metal mask thickness) in a 5×5 mm sized region on a nickel-plated copper substrate (20×20 mm, thickness 2 mm);
(2) Measuring the area of the paste one minute after the applying;
(3) Placing the copper substrate on a hot plate at normal temperature and heating the copper substrate until the copper substrate reaches a predetermined temperature;
(4) Removing the copper substrate from the hot plate when the predetermined temperature is reached and cooling the copper substrate; and
(5) Measuring the area of the paste on the copper substrate after the cooling;
where the predetermined temperature in the procedure (3) is the temperature for reduction with the reducing gas when the reducing gas is formic acid or hydrogen, and
wherein the solvent shows a weight loss of 25% or more at a rate of temperature increase of 10° C./min in thermogravimetry (TG) under normal pressure at 180° C.

6. A method for producing a soldered product, comprising:
providing a solder paste according to claim 1;
applying the solder paste to a soldering target;
evaporating the solvent by heating the soldering target with the solder paste applied thereto to any temperature lower than a melting temperature of the solder powder;
concurrently with or after the evaporating, reducing the solder powder left as a result of the evaporating and the soldering target with the reducing gas at any temperature lower than a melting temperature of the solder powder; and
after the reducing, melting the solder powder by heating the soldering target to any temperature equal to or higher than a melting temperature of the solder powder.

7. The method for producing a soldered product according to claim 6,
further comprising placing the soldering target in a vacuum;
wherein, in the evaporating, the solvent is evaporated by heating the soldering target in the vacuum.

8. The method for producing a soldered product according to claim 7,
wherein, in the evaporating, gaps are formed between the solder powder particles as a result of evaporation of the solvent, and
wherein, in the reducing, the soldering target is reduced by introducing the reducing gas into the gaps after the soldering target is placed in the vacuum.

9. The method for producing a soldered product according to claim 7,
wherein, in the melting, the solder powder is melted by heating the soldering target to a melting temperature of the solder powder or higher after the soldering target is placed in the vacuum, and
further comprising:
after the melting, breaking the vacuum where the solder powder is placed by increasing pressure to compress or eliminate cavities (voids) in the solder powder; and
after the breaking, cooling the soldering target.

10. The method for producing a soldered product according to claim 7,
wherein the reducing gas is a formic acid gas in the reducing.

11. The solder paste for use with a reducing gas according to claim 2,
wherein the thixotropic agent is an amide-based thixotropic agent.

12. A method for producing a soldered product, comprising:
providing a solder paste according to claim 2;
applying the solder paste to a soldering target;
evaporating the solvent by heating the soldering target with the solder paste applied thereto to any temperature lower than a melting temperature of the solder powder;
concurrently with or after the evaporating, reducing the solder powder left as a result of the evaporating and the soldering target with the reducing gas at any temperature lower than a melting temperature of the solder powder; and
after the reducing, melting the solder powder by heating the soldering target to any temperature equal to or higher than a melting temperature of the solder powder.

13. The method for producing a soldered product according to claim 12,
further comprising placing the soldering target in a vacuum;
wherein, in the evaporating, the solvent is evaporated by heating the soldering target in the vacuum.

14. The method for producing a soldered product according to claim 13,
wherein, in the evaporating, gaps are formed between the solder powder particles as a result of evaporation of the solvent and
wherein, in the reducing, the soldering target is reduced by introducing the reducing gas into the gaps after the soldering target is placed in the vacuum.

15. The method for producing a soldered product according to claim 13, wherein, in the melting, the solder powder is melted by heating the soldering target to a melting temperature of the solder powder or higher after the soldering target is placed in the vacuum, and further comprising:

after the melting, breaking the vacuum where the solder powder is placed by increasing pressure to compress or eliminate cavities (voids) in the solder powder; and after the breaking, cooling the soldering target.

16. The method for producing a soldered product according to claim 13, wherein the reducing gas is a formic acid gas in the reducing.

17. The solder paste for use with a reducing gas according to claim 5, wherein the solder powder and the thixotropic agent melt at a temperature higher than the temperature for reduction with the reducing gas when the reducing gas is formic acid or hydrogen.

18. The solder paste for use with a reducing gas according to claim 5, wherein the thixotropic agent is an amide-based thixotropic agent.

19. A method for producing a soldered product, comprising:

providing a solder paste according to claim 5;

applying the solder paste to a soldering target;

evaporating the solvent by heating the soldering target with the solder paste applied thereto to any temperature lower than a melting temperature of the solder powder;

concurrently with or after the evaporating, reducing the solder powder left as a result of the evaporating and the soldering target with the reducing gas at any temperature lower than a melting temperature of the solder powder; and after the reducing, melting the solder powder by heating the soldering target to any temperature equal to or higher than a melting temperature of the solder powder.

20. The method for producing a soldered product according to claim 19, further comprising placing the soldering target in a vacuum;

wherein, in the evaporating, the solvent is evaporated by heating the soldering target in the vacuum.

21. The method for producing a soldered product according to claim 20, wherein, in the evaporating, gaps are formed between the solder powder particles as a result of evaporation of the solvent, and wherein, in the reducing, the soldering target is reduced by introducing the reducing gas into the gaps after the soldering target is placed in the vacuum.

22. The method for producing a soldered product according to claim 20, wherein, in the melting, the solder powder is melted by heating the soldering target to a melting temperature of the solder powder or higher after the soldering target is placed in the vacuum, and further comprising:

after the melting, breaking the vacuum where the solder powder is placed by increasing pressure to compress or eliminate cavities (voids) in the solder powder; and after the breaking, cooling the soldering target.

23. The method for producing a soldered product according to claim 20, wherein the reducing gas is a formic acid gas in the reducing.

* * * * *